(12) United States Patent
Tu

(10) Patent No.: US 7,163,853 B2
(45) Date of Patent: Jan. 16, 2007

(54) METHOD OF MANUFACTURING A CAPACITOR AND A METAL GATE ON A SEMICONDUCTOR DEVICE

(75) Inventor: Kuo-Chi Tu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 111 days.

(21) Appl. No.: 11/054,448

(22) Filed: Feb. 9, 2005

(65) Prior Publication Data

US 2006/0177979 A1    Aug. 10, 2006

(51) Int. Cl.
    *H01L 21/338*   (2006.01)
(52) U.S. Cl. .............. 438/183; 438/926; 438/243; 438/244; 438/386; 257/E21.396
(58) Field of Classification Search ............. 418/183, 418/926, 243, 244, 386
    See application file for complete search history.

(56) References Cited

U.S. PATENT DOCUMENTS

| 4,963,501 A * | 10/1990 | Ryan et al. .............. 438/183 |
| 6,387,750 B1 | 5/2002 | Lai et al. |
| 6,613,621 B1 * | 9/2003 | Uh et al. .............. 438/183 |
| 2002/0024119 A1 * | 2/2002 | Tanaka et al. .............. 257/649 |
| 2005/0255642 A1 * | 11/2005 | Liu et al. .............. 438/183 |

OTHER PUBLICATIONS

Hang Hu, "A High Performance MIM Capacitor Using HfO₂ Dielectrics", IEEE Electron Device Letters, vol. 23, No. 9, Sep. 2002, 0741-3106/02, pp. 514-516.
Chi Shih Chang, "Applications of Metal-Insulator-Metal (MIM) Capacitors", International SeMaTech, 20 pages.

* cited by examiner

Primary Examiner—Asok K. Sarkar
Assistant Examiner—Victor V. Yevsikov
(74) Attorney, Agent, or Firm—Haynes and Boone, LLP

(57) ABSTRACT

A method of manufacturing a capacitor and a metal gate on a semiconductor device comprises forming a dummy gate on a substrate, forming a trench layer on the substrate and adjacent the dummy gate, forming a capacitor trench in the trench layer, forming a bottom electrode layer in the capacitor trench, removing the dummy gate to provide a gate trench, forming a dielectric layer in the capacitor trench and the gate trench, and forming a metal layer over the dielectric layer in the capacitor trench and the gate trench.

16 Claims, 33 Drawing Sheets

FIGURE 19a

METHOD OF MANUFACTURING A CAPACITOR AND A METAL GATE ON A SEMICONDUCTOR DEVICE

BACKGROUND

This disclosure relates generally to semiconductor manufacturing and more particularly to a method of manufacturing a capacitor and a metal gate on a semiconductor device.

In the semiconductor industry, metal-oxide semiconductor (MOS) transistors have typically been formed using polysilicon gate electrodes. Polysilicon material has been preferred due to its thermal resistive properties during high temperature processing, which allows it to be annealed at high temperatures along with the source and drain regions. Furthermore, polysilicon's ability to block the ion implantation of doping atoms into the channel region is advantageous, as it allows for the easy formation of self aligned source and drain structures after gate patterning is completed.

However, polysilicon gate electrodes suffer from certain disadvantages. Polysilicon gate electrodes are formed from semiconductor materials that have relatively high resistivity compared to most metal materials. This causes the polysilicon gate electrode to operate at a slower speeds compared to a gate electrode made of a metal material. To compensate for the high resistance and corresponding lower operation speed, the polysilicon materials often require extensive and expensive silicide processing in order to increase their speed of operation to an acceptable level.

Another disadvantage to using polysilicon gate electrodes is the polysilicon depletion effect. This occurs because polysilicon can presently only be doped to a range of about $2 \times 10^{20}$ cm$^3$ to about $3 \times 10^{20}$ cm$^3$. Ideally, a doping concentration of at least $5 \times 10^{21}$ cm$^3$ is desired in the gate material. Because of the doping limit, when a polysilicon gate is biased, a depletion region near the polysilicon gate and gate dielectric interface is generated due to the lack of carriers.

Therefore, it is desirable to replace the polysilicon gate electrode with a metal gate electrode. The problem then arises of how to integrate capacitor fabrication with the metal gate process while achieving a cost competitive process.

Accordingly, it would be desirable to provide a method of manufacturing a capacitor and a metal gate on a semiconductor device absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

In the following, FIGS. 2, 3, 4, 5a, 6a, 7a, 8a, 9a, 10a, 11a, 12a, 13, 14a, 15a, 16a, 17a, 18a, and 19a illustrate an embodiment of forming a capacitor and a metal gate in various manufacturing stages. FIGS. 2, 3, 4, 5b, 6b, 7b, 8b, 9b, 10b, 11b, 12b, 13, 14b, 15b, 16b, 17b, 18b, and 19b illustrate an embodiment of forming a self-aligned capacitor and a metal gate using a selective etching in various manufacturing stages.

FIG. 2 is a cross sectional view illustrating an embodiment of a substrate with a dummy gate on the substrate surface.

FIG. 3 is a cross sectional view illustrating an embodiment of a trench layer formed on the substrate of FIG. 2.

FIG. 4 is a cross sectional view illustrating an embodiment of a layer of photoresist formed on the trench layer of FIG. 3.

FIGS. 5a is a perspective view illustrating an embodiment of a mask having a circular passageway situated over the photoresist of FIG. 4.

FIGS. 5b is a perspective view illustrating another embodiment of a mask having a rectangular passageway situated over the photoresist of FIG. 4.

FIG. 6a is a cross sectional view taken along line 6a of FIG. 5a illustrating an embodiment of photoresist patterning.

FIG. 6b is a cross sectional view taken along line 6b of FIG. 5b illustrating an embodiment of photoresist patterning.

FIG. 7a is a perspective view illustrating an embodiment of a capacitor trench formed in the trench layer of FIG. 6a.

FIG. 7b is a perspective view illustrating an embodiment of a capacitor trench formed in the trench layer of FIG. 6b.

FIG. 8a is a cross sectional view taken along line 8a of FIG. 7a illustrating an embodiment of a capacitor trench etched in the trench layer.

FIG. 8b is a cross sectional view taken along line 8b of FIG. 7b illustrating an embodiment of a capacitor trench etched in the trench layer.

FIG. 9a is a cross sectional view illustrating an embodiment of a bottom electrode layer formed on the trench layer and in the capacitor trench of FIG. 8a.

FIG. 9b is a cross sectional view illustrating an embodiment of a bottom electrode layer formed on the trench layer and in the capacitor trench of FIG. 8b.

FIG. 10a is a perspective view illustrating an embodiment of the bottom electrode layer of FIG. 9a planarized with the trench layer such that a bottom electrode is located in the capacitor trench of FIG. 7a.

FIG. 10b is a perspective view illustrating an embodiment of the bottom electrode layer of FIG. 9b planarized with the trench layer such that a bottom electrode is located in the capacitor trench of FIG. 7b.

FIG. 11a is a cross sectional view taken along line 11a of FIG. 10a illustrating an embodiment of the bottom electrode layer planarized with the trench layer such that a bottom electrode is located in the capacitor trench of FIG. 7a.

FIG. 11b is a cross sectional view taken along line 11b of FIG. 10b illustrating an embodiment of the bottom electrode layer planarized with the trench layer such that a bottom electrode is located in the capacitor trench of FIG. 7b.

FIG. 12a is a cross sectional view illustrating an embodiment of a layer of photoresist formed on the trench layer and over the bottom electrode in the capacitor trench of FIG. 11a.

FIG. 12b is a cross sectional view illustrating an embodiment of a layer of photoresist formed on the trench layer and over the bottom electrode in the capacitor trench of FIG. 11b.

FIG. 13 is a cross sectional view illustrating an embodiment of a mask situated over the photoresist.

FIG. 14a is a perspective view illustrating an embodiment of a micro trench etched partially in the bottom electrode and the trench layer of FIG. 11a.

FIG. 14b is a perspective view illustrating an embodiment of a micro trench etched partially in the bottom electrode and the trench layer of FIG. 11b.

FIG. 15a is a cross sectional view taken along line 15a of FIG. 14a illustrating an embodiment of a micro trench etched partially in the bottom electrode and the trench layer of FIG. 11a.

FIG. 15b is a cross sectional view taken along line 15b of FIG. 14b illustrating an embodiment of a micro trench etched partially in the bottom electrode and the trench layer of FIG. 11b.

FIG. 16a is a cross sectional perspective view illustrating an embodiment of a gate channel, defined by the trench layer and the substrate, formed by removing the dummy gate of FIG. 15a.

FIG. 16b is a cross sectional perspective view illustrating an embodiment of a gate channel, defined by the trench layer and the substrate, formed by removing the dummy gate of FIG. 15b.

FIG. 17a is a cross sectional view illustrating an embodiment of a dielectric layer formed on the trench layer, the bottom electrode, the micro trench, and the gate channel of FIG. 16a.

FIG. 17b is a cross sectional view illustrating an embodiment of a dielectric layer formed on the trench layer, the bottom electrode, the micro trench, and the gate channel of FIG. 16b.

FIG. 18a is a cross sectional view illustrating an embodiment of a metal layer formed on the dielectric layer of FIG. 17a.

FIG. 18b is a cross sectional view illustrating an embodiment of a metal layer formed on the dielectric layer of FIG. 17b.

FIG. 19a is a perspective view illustrating an embodiment of the dielectric layer and the metal layer of FIG. 18a planarized with the trench layer to form a capacitor, a metal gate, and a connection pad.

FIG. 19b is a perspective view illustrating an embodiment of the dielectric layer and the metal layer of FIG. 18b planarized with the trench layer to form a capacitor, a metal gate, and a connection pad.

DETAILED DESCRIPTION

Figure 1:
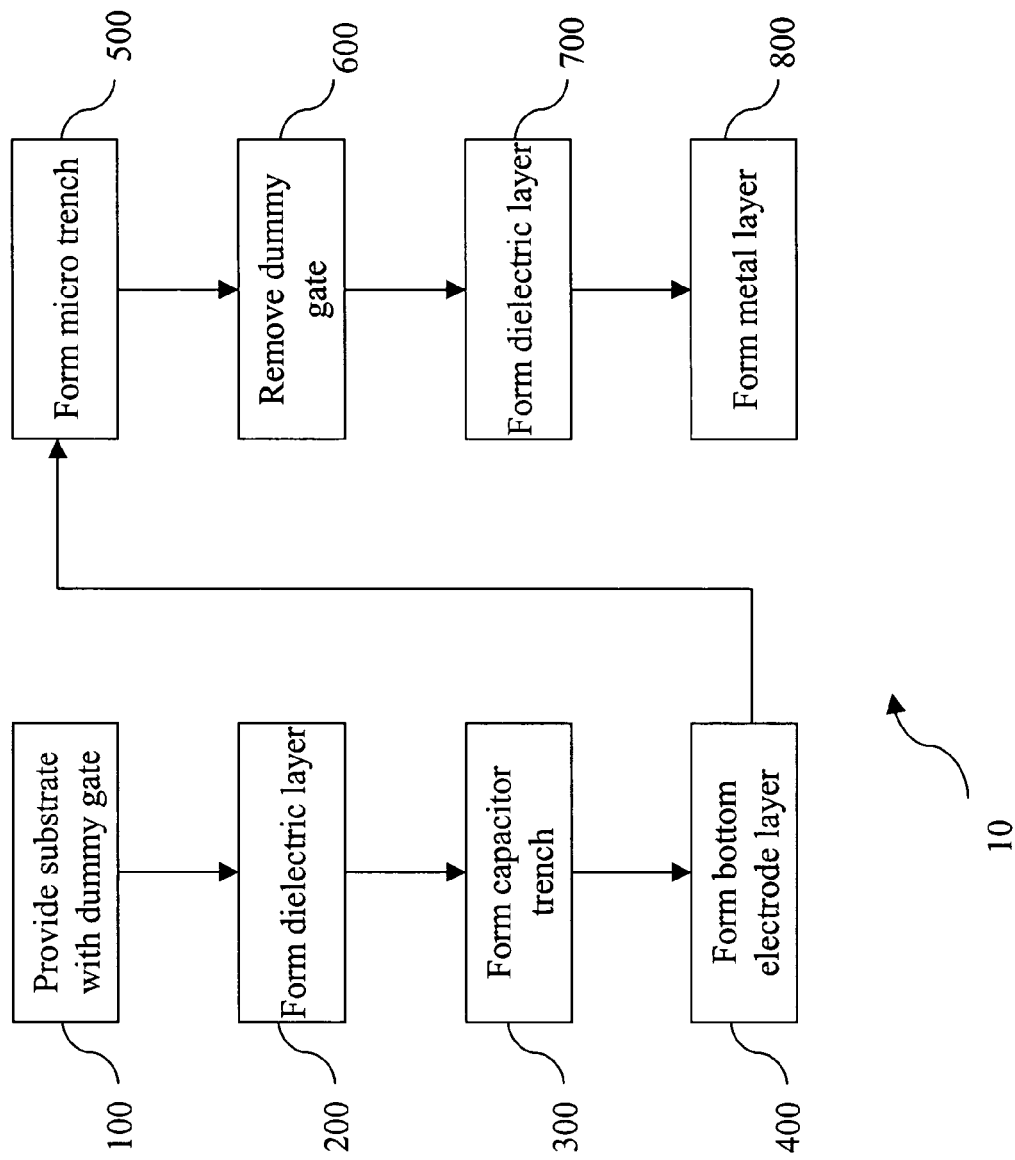
FIG. 1 is a flow chart illustrating an embodiment of a method of manufacturing a capacitor and a metal gate on a semiconductor device.

Referring to FIG. 1, a method 10 for manufacturing a capacitor along with a metal gate is illustrated. The method 10 includes steps 100, 200, 300, 400, 500, 600, 700, and 800, with each step explained in detail below.

Figure 2:
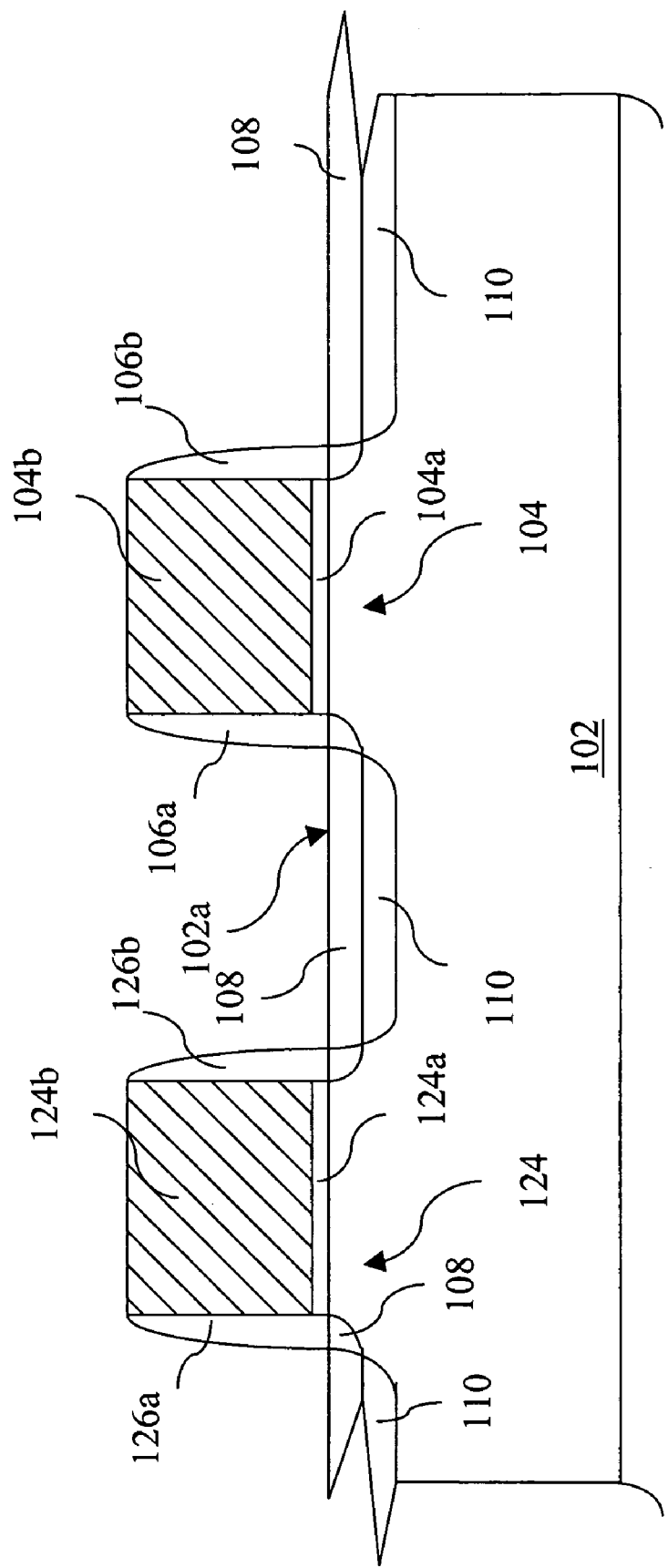

Referring now to FIGS. 1 and 2, the method 10 begins at step 100 where a substrate 102 is provided. The substrate 102 includes a substrate surface 102a. The substrate 102 may be an elementary semiconductor such as silicon, germanium, and diamond. The substrate 102 may comprise a compound semiconductor and/or an alloy semiconductor. The substrate 102 may include an epitaxial layer, may be strained for performance enhancement, and may comprise a semiconductor-on-insulator (SOI) structure.

A dummy gate 104, including a dummy dielectric 104a (such as silicon oxide) and a dummy gate electrode 104b (such as polysilicon), may be situated on the substrate 102. The dummy gate 104 may further comprise a plurality of spacers 106a and 106b located on both sidewalls of the dummy gate 104. Similarly, another dummy gate 124 may be situated on the substrate 102, approximate to the dummy gate 104. The dummy gate 124 may also include a dummy dielectric 124a and a dummy gate electrode 124b, and a plurality of spacers 126a and 126b located on both sidewalls of the dummy gate 124. The dummy gates 104 and 124 may be substantially similar in composition, formation, and configuration. The exemplary dummy gates 104 and 124 are illustrated only for simplicity and without limiting. The dummy gates 104 and 124 may be situated in a memory device region of the substrate 102, for example.

The substrate 102 may include a plurality of doped regions such as source and drain extension regions (SDE or LDD) 108; and heavy source and drain doped regions 110 adjacent the dummy gates 104 and 124. A silicide feature (not shown) may be disposed on the doped region 110 of the substrate between the dummy gates 104 and 124 to form a contact. Alternatively, the silicide may be disposed on the doped regions 110 proximate both sides of the dummy gates 104 and 124, being adjacent the gate spacers 106a and 106b, respectively. The silicide may comprise nickel silicide, cobalt silicide, tungsten silicide, tantalum silicide, titanium silicide, platinum silicide, erbium silicide, palladium silicide, or combinations thereof. The silicide may be formed by a process such as self-aligned silicide (salicide) method. The dummy gates and doped regions may be formed by methods including thermal oxidation, polysilicon deposition, photolithography, ion implantation, etching, and various other methods known in the art.

Figure 3:
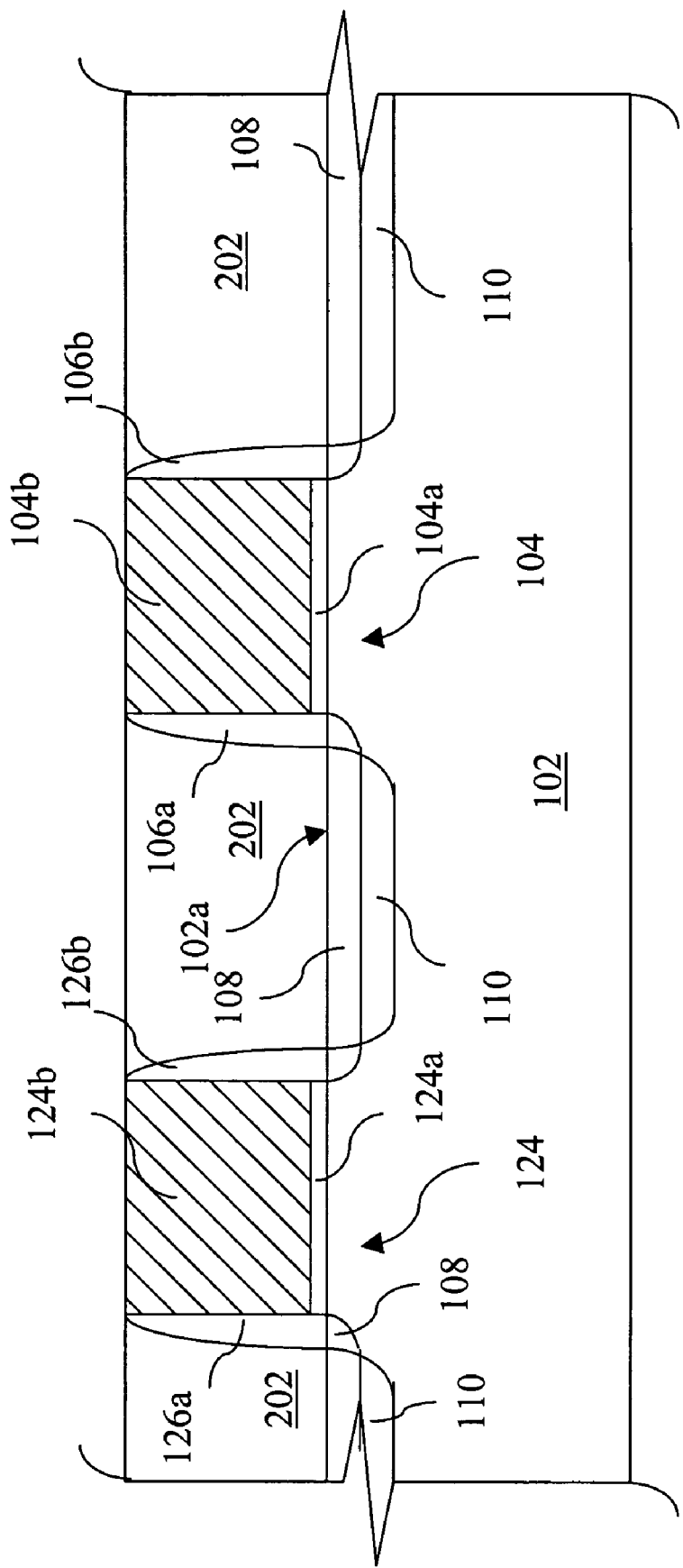
Figure 4:
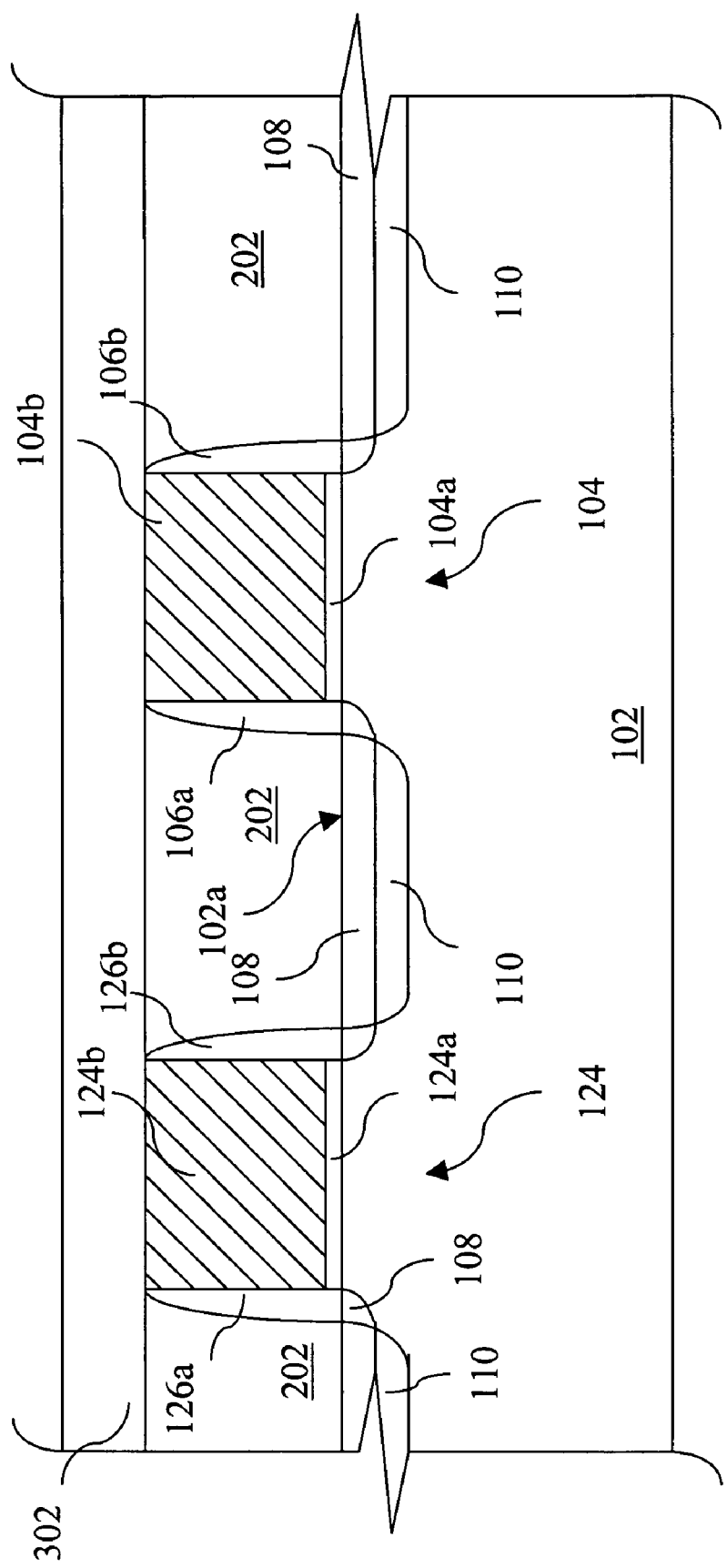

Referring now to FIGS. 1 and 3, the method 10 continues at step 200 where a dielectric layer 202 is formed on the substrate 102 and the dummy gates. In an exemplary embodiment, the dielectric layer 202 includes silicon oxide material. The dielectric layer 202 may include fluorinated silica glass (FSG), carbon doped silicon oxide, silicon nitride, silicon oxynitride, combinations thereof, or other proper material such as low dielectric-constant (low K) material wherein the dielectric constant of the low K material is low than 3.9, the dielectric constant of thermal silicon dioxide. The dielectric layer 202 may be formed by a proper deposition process such as chemical vapor deposition (CVD), physical vapor deposition (PVD), atomic layer deposition (ALD), spin-on glass (SOG), and/or other suitable process. The dielectric layer 202 may be then planarized with the dummy gates 104 and 124 such that the dielectric layer 202 is coplanar with the top surface of the dummy gates. In an exemplary embodiment, the planarization of the dielectric layer 202 with the dummy gate 104 is achieved by chemical mechanical polishing (CMP) or other proper process.

Figure 5A:
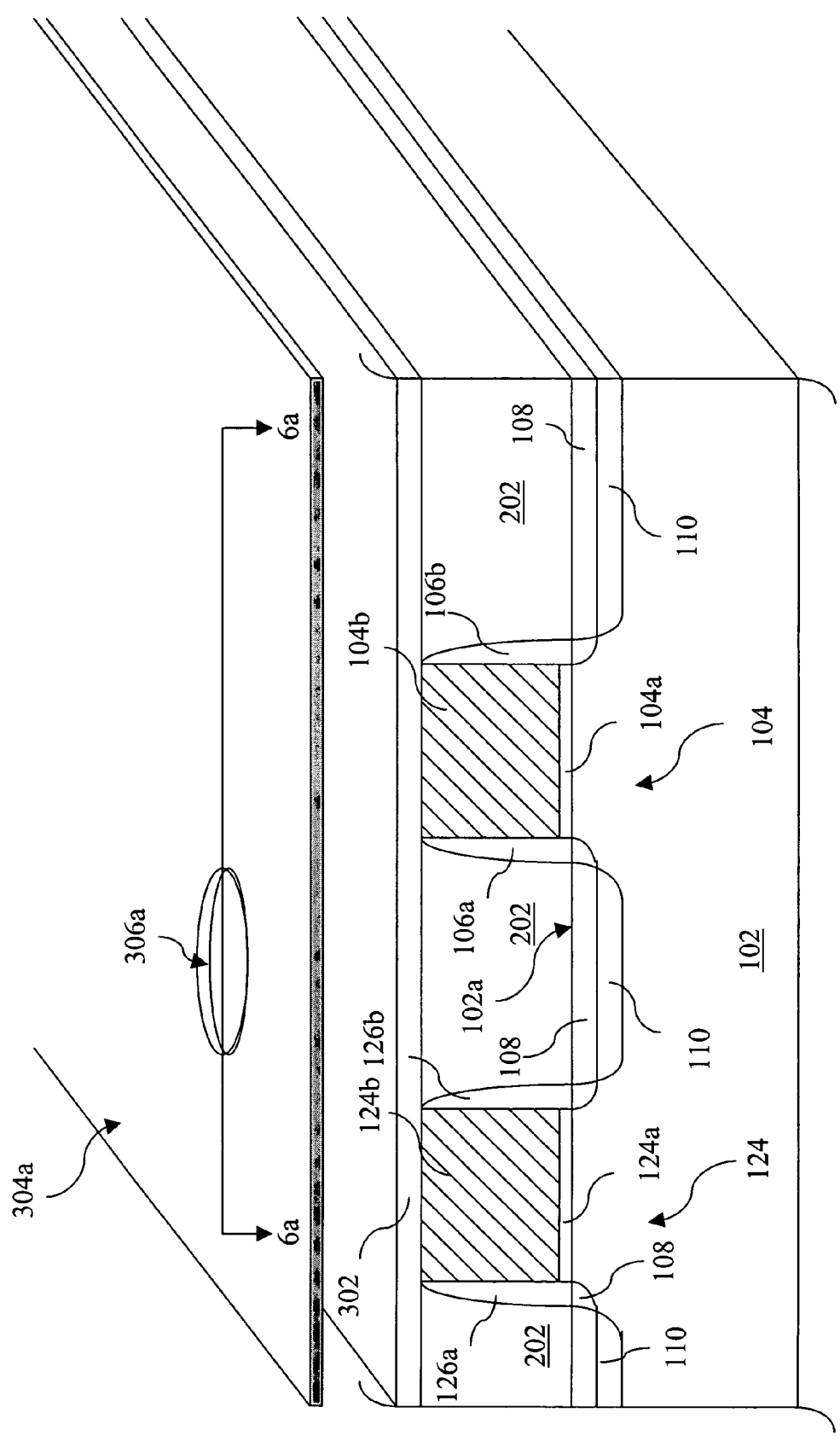

Referring now to FIGS. 1, 4, 5a, 6a, 7a, and 8a, the method 10 continues at step 300 to form a capacitor trench. In one embodiment, the dielectric layer 202 may be patterned and etched to form a trench using a suitable patterning methods known in the art such as photolithography and etching. A layer of photoresist 302 may be formed over the dielectric layer 202 and the dummy gates 104 and 124. A photomask 304a defining a passageway 306a may be positioned over the photoresist 302 during photolithography processing. The passageway 306a may be designed in a proper shape such as a circular, an ellipse, and a rectangular. Illustrated in FIG. 5a is an exemplary circular passageway 306a. An ultra violet (UV) or deep ultra violet (DUV) light may be shined on the mask 304a during photolithography processing. The photoresist 302 is exposed to the light through the circular passageway 306a. Physical properties of a portion 308 of the photoresist 302 are changed by exposure to the light. Development of the photoresist 302 defines a circular opening 310a in the photoresist, exposing a portion of the dielectric layer 202. The photoresist opening 310a allows the dielectric layer 202 to be etched, resulting in a capacitor trench 312a which may extend to the substrate surface 102a. Etching may be performed using methods known in the art including, but not limited to, wet etching, dry etching, reactive ion etching (RIE), and other suitable process. The photoresist 302 may be then removed by wet stripping or plasma ashing.

Figure 5B:
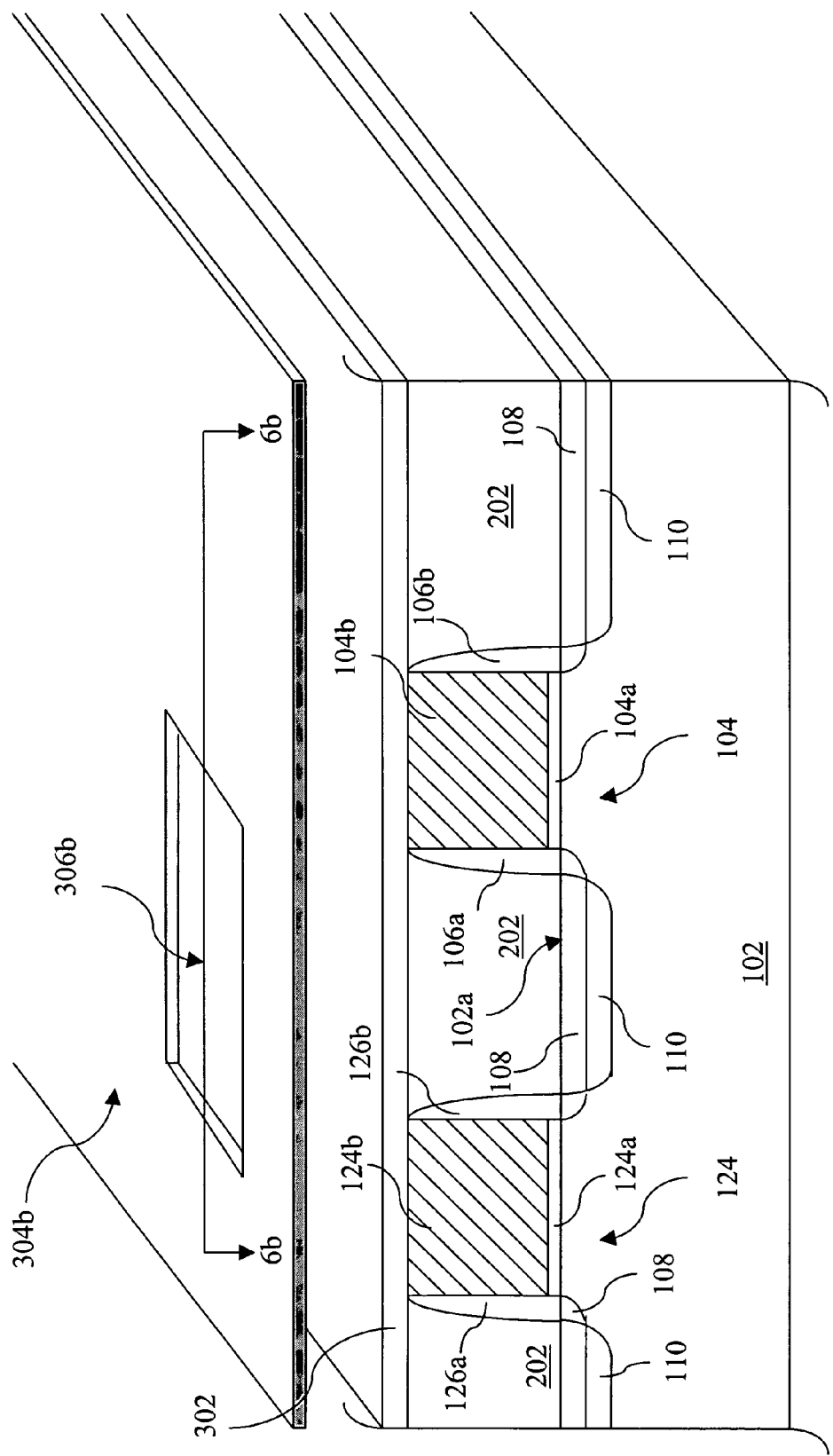
Figure 6A:
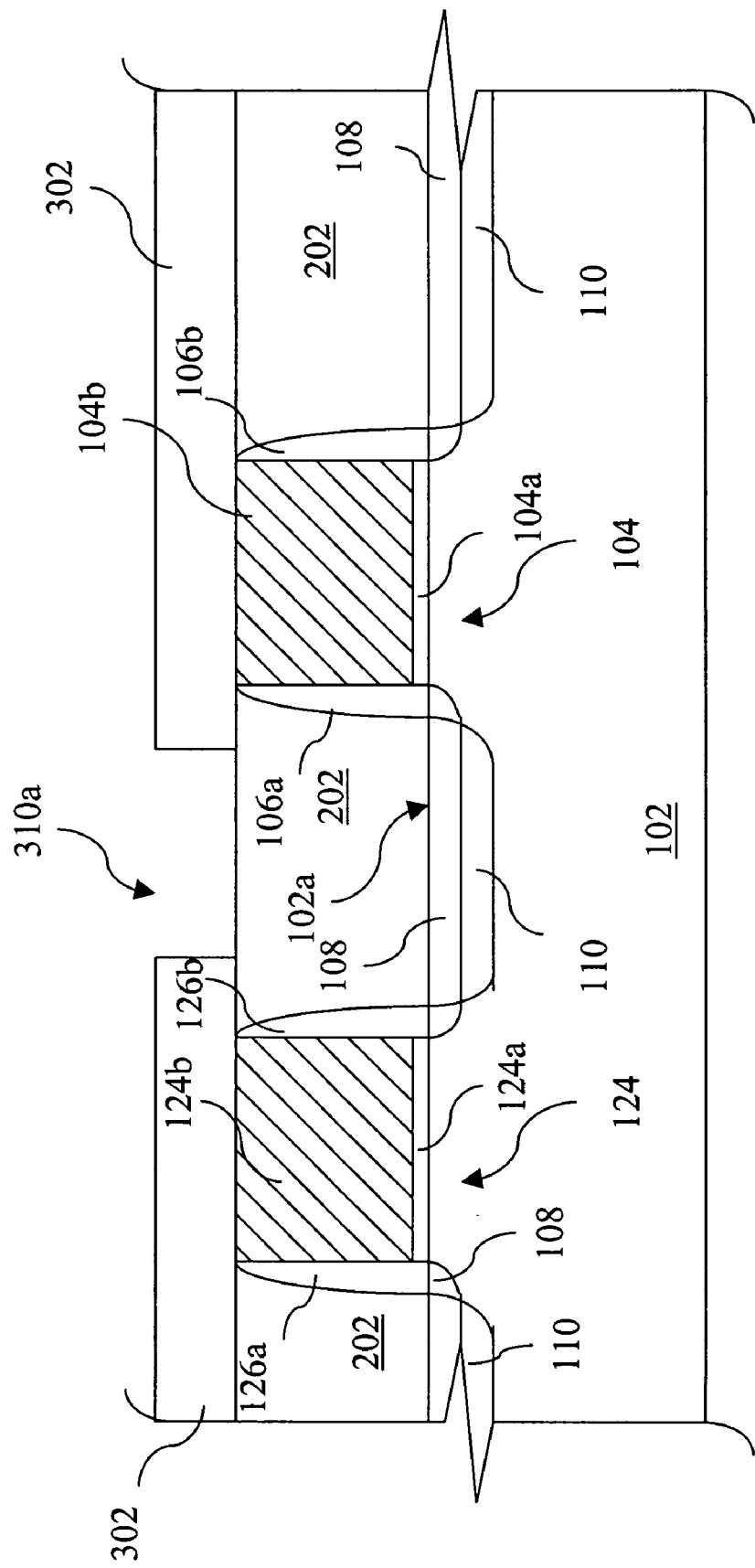
Figure 6B:
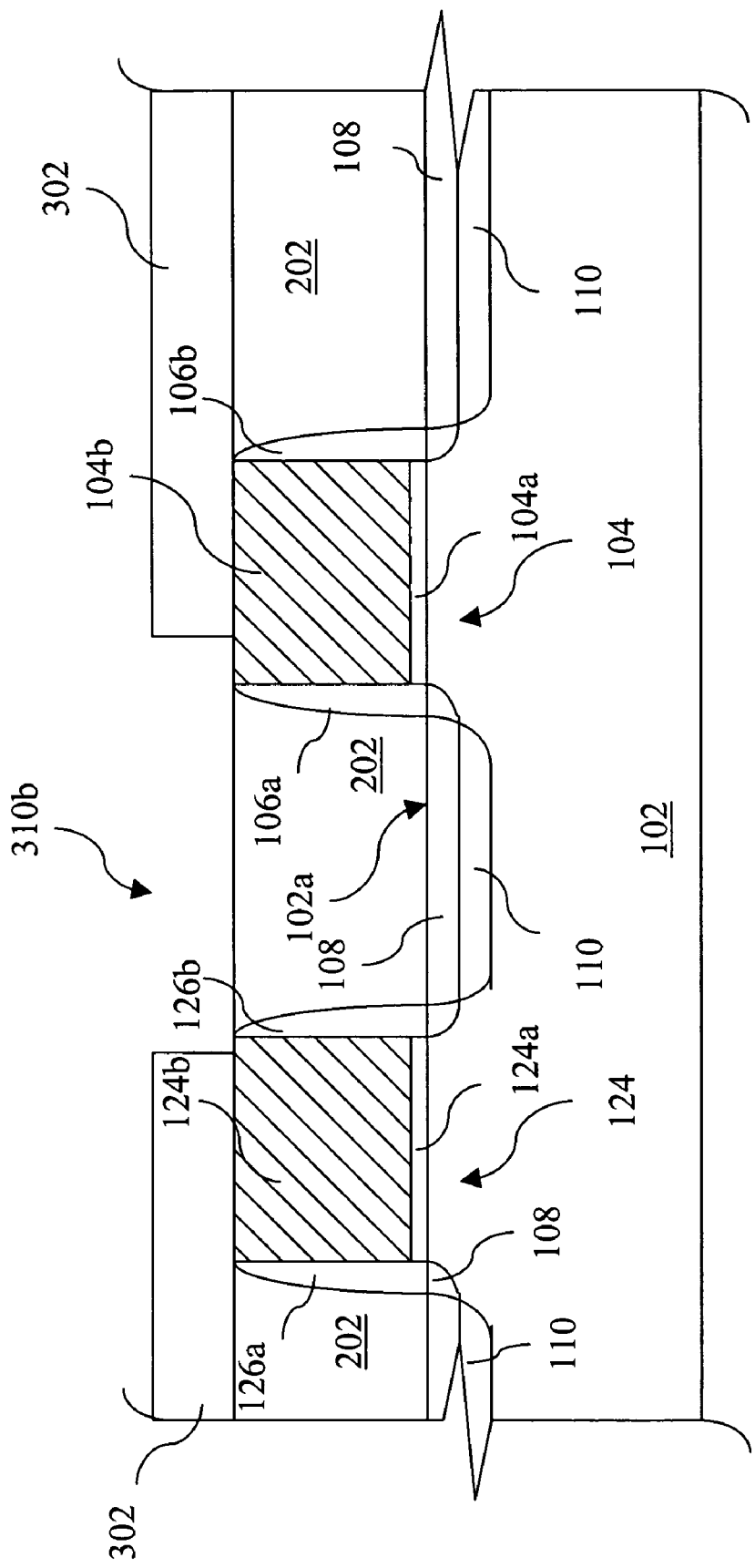
Figure 7A:
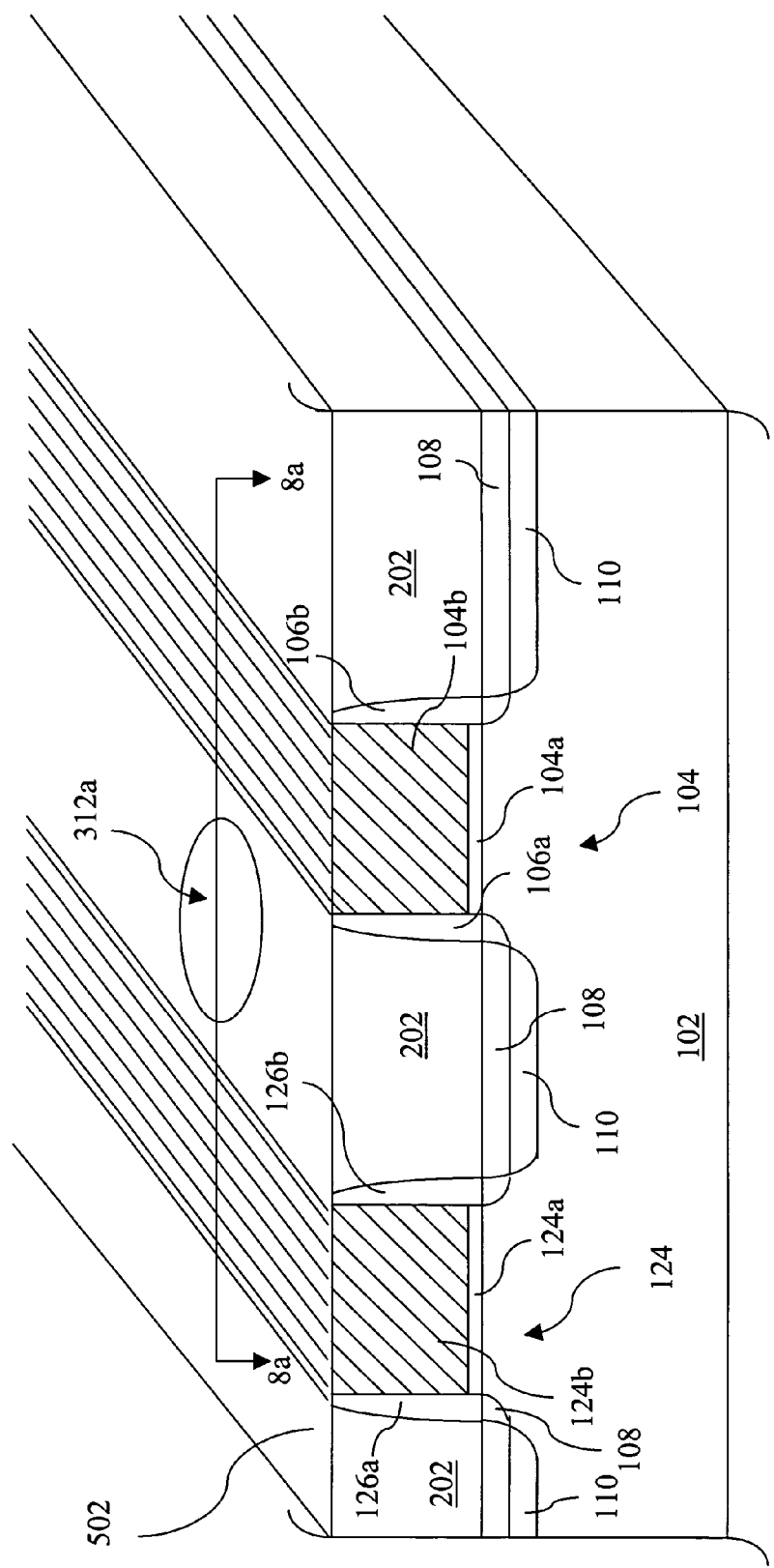
Figure 7B:
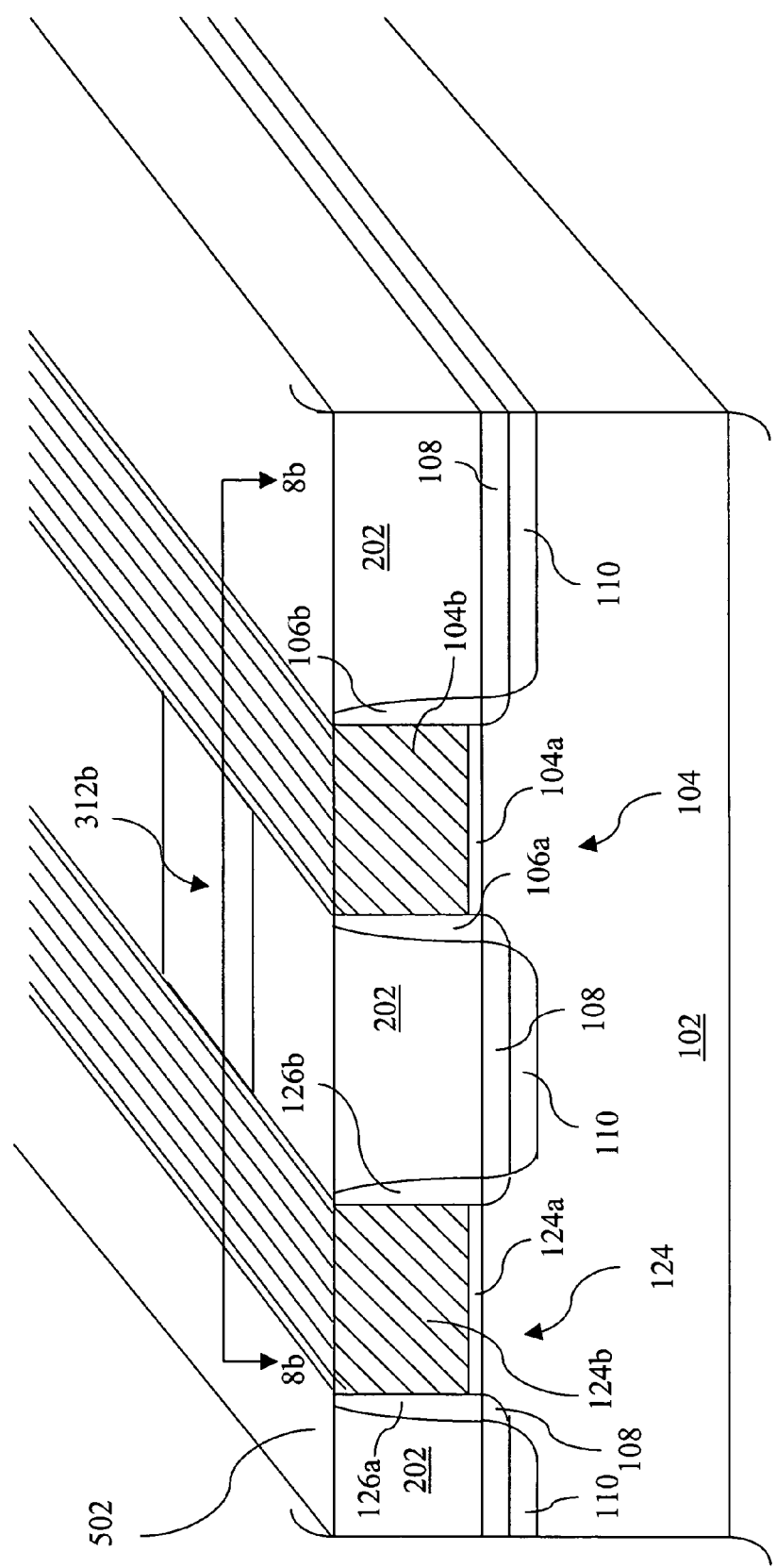
Figure 8A:
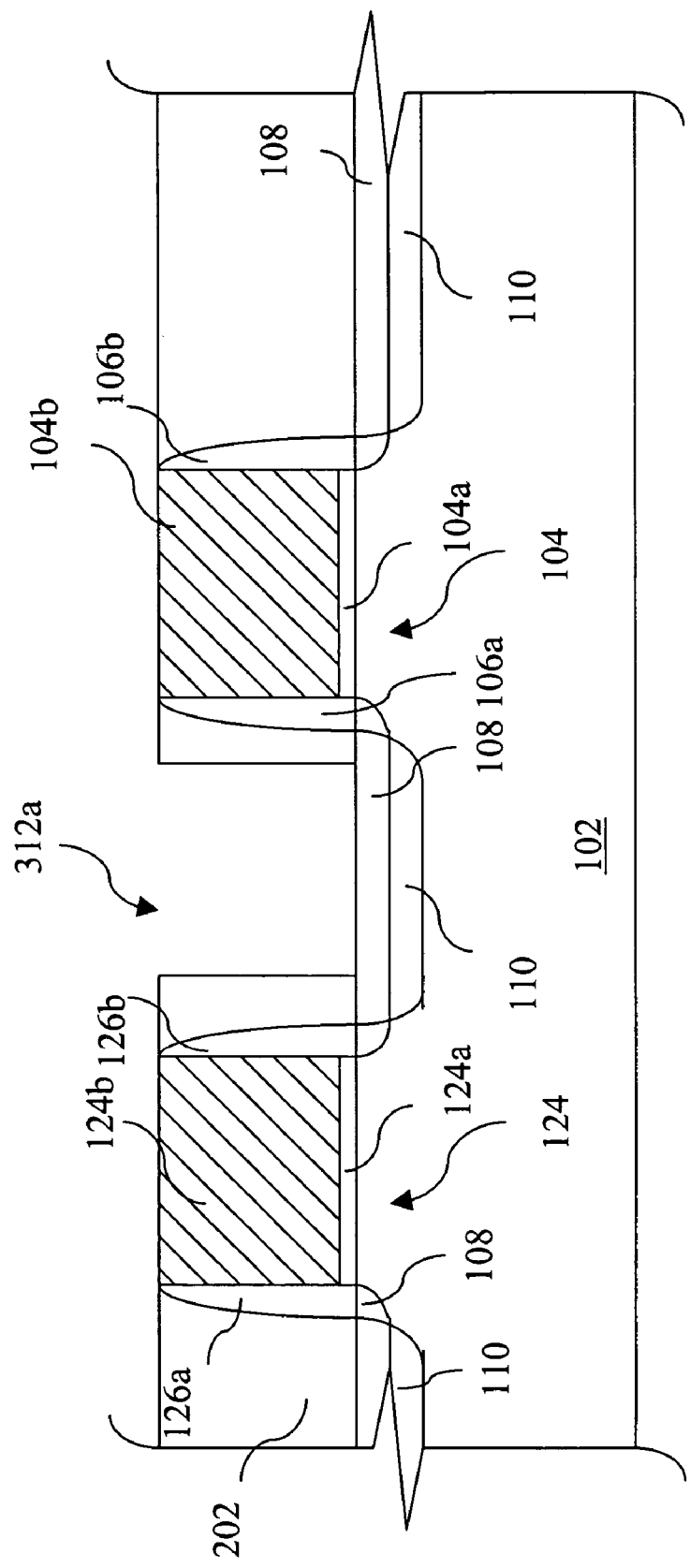
Figure 8B:
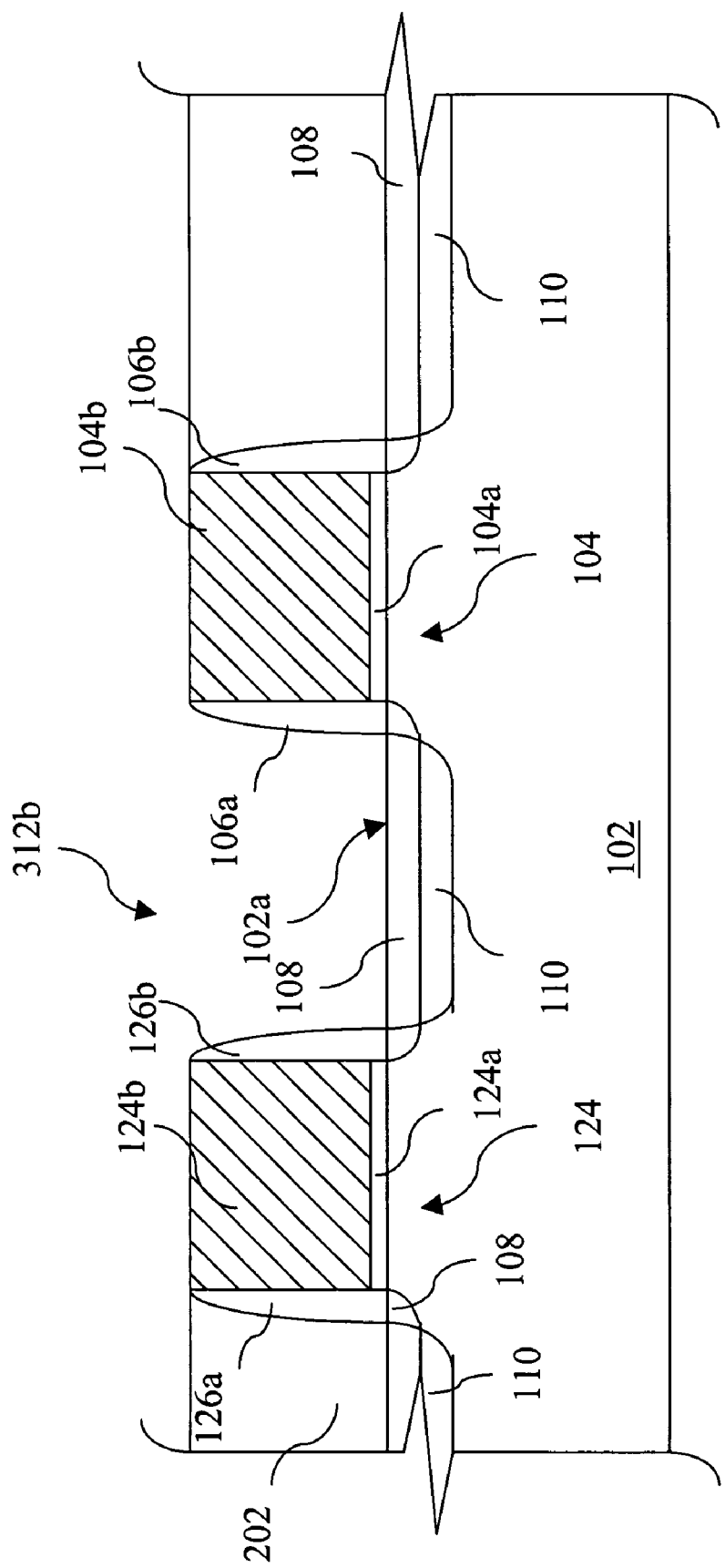
Figure 9A:
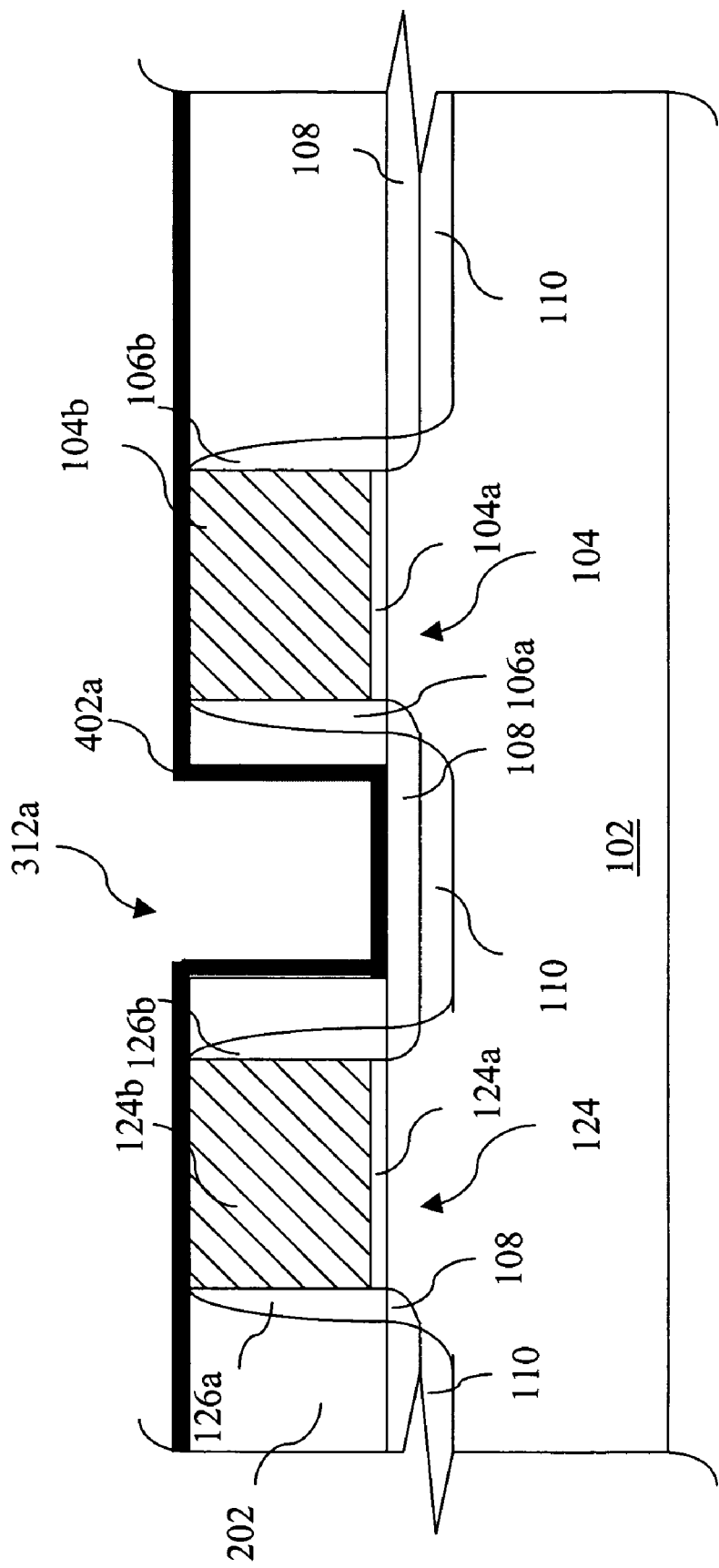
Figure 9B:
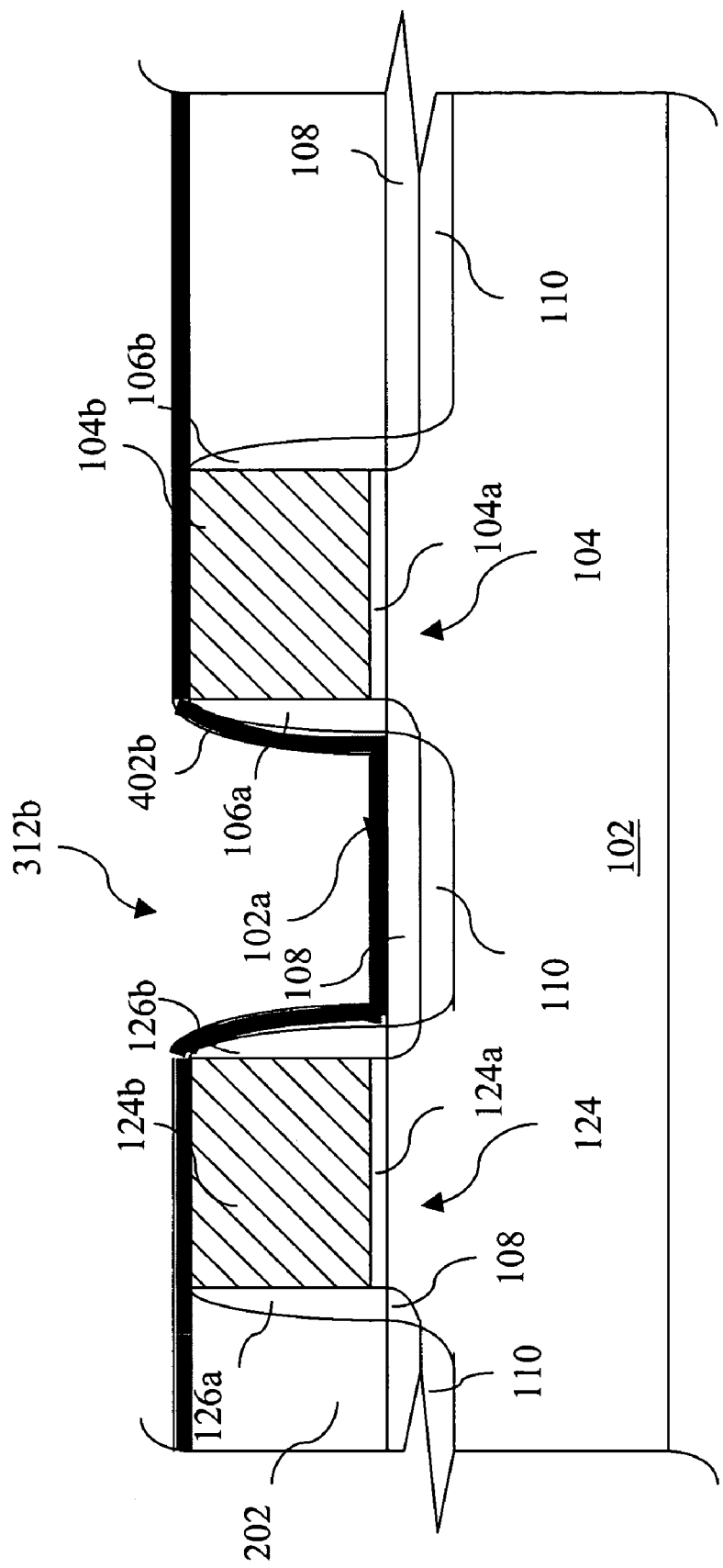
Figure 10A:
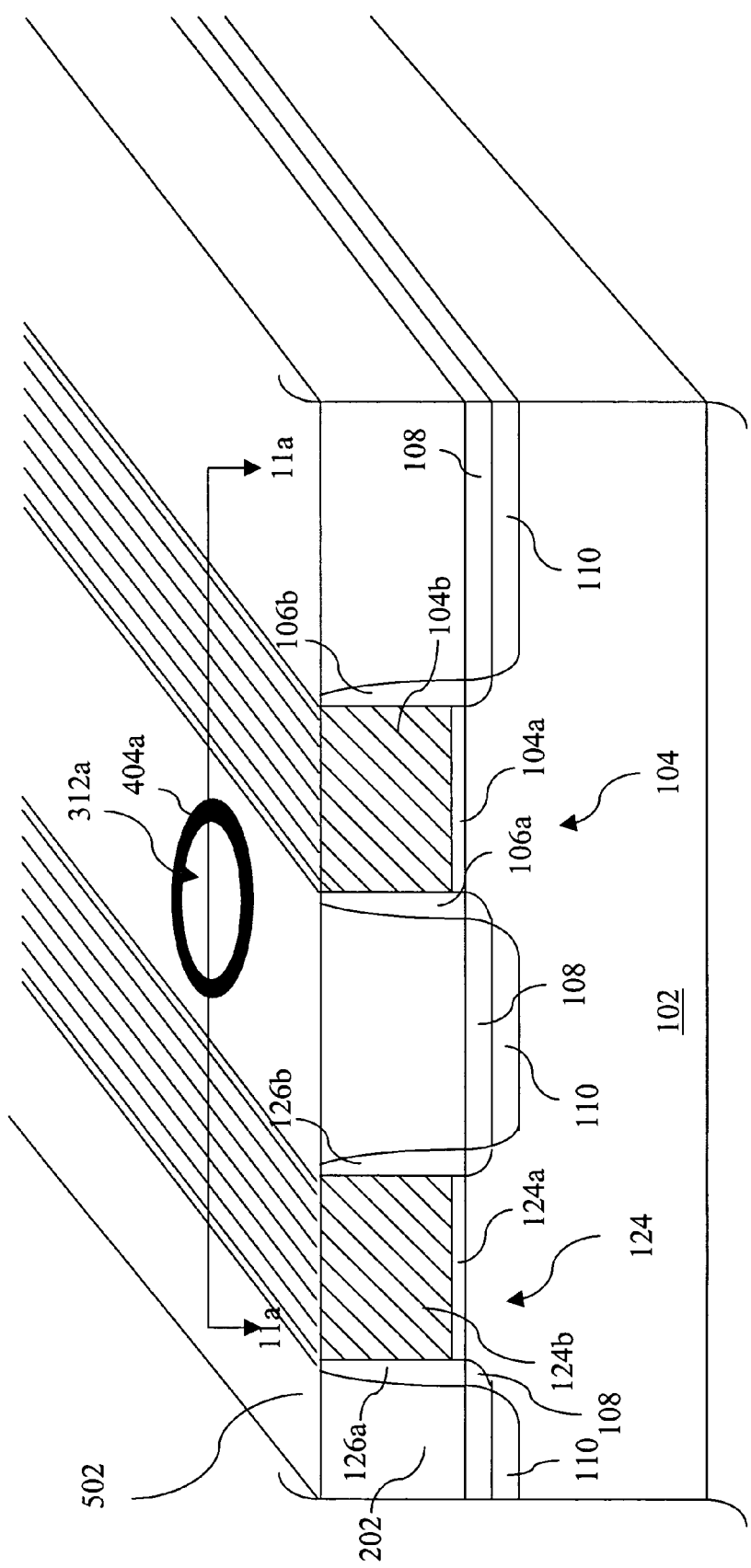
Figure 10B:
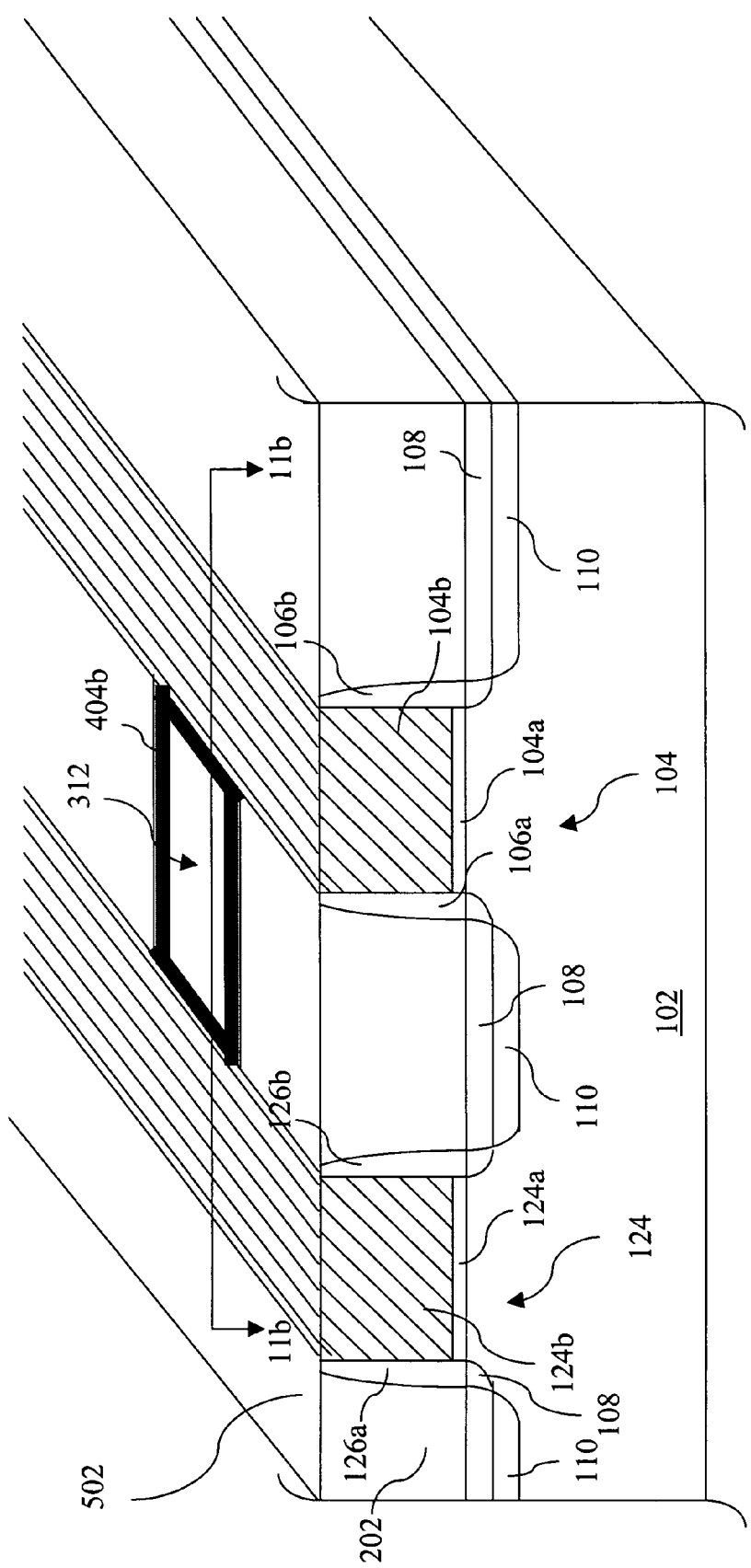
Figure 11A:
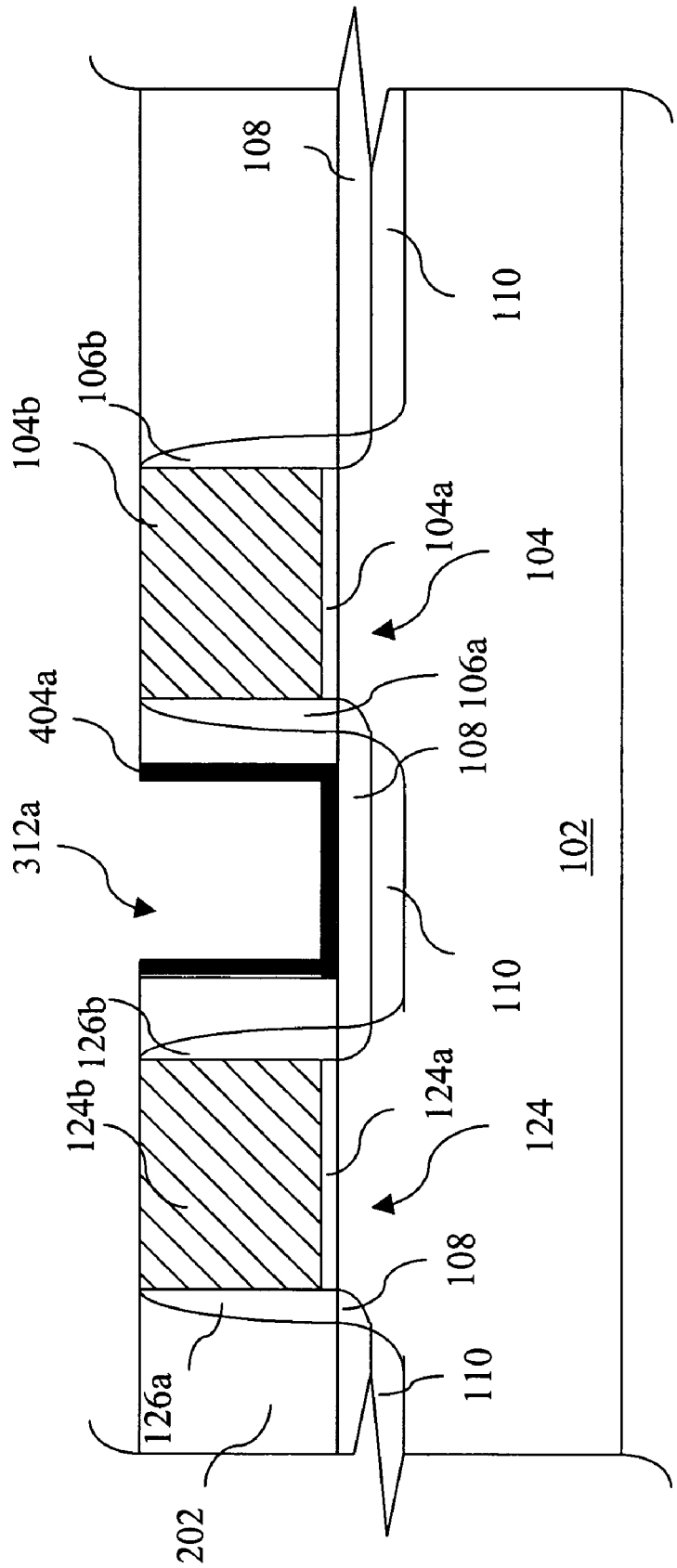
Figure 11B:
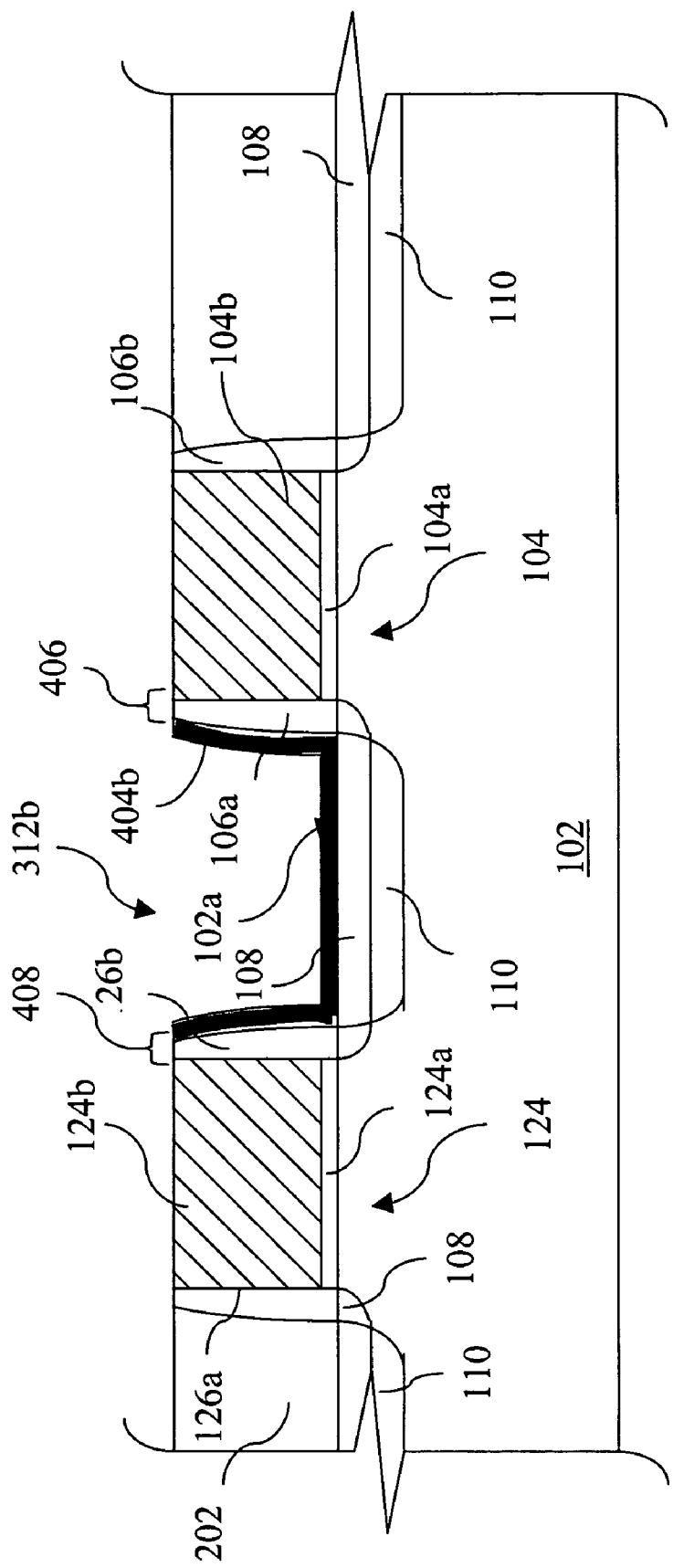
Figure 12A:
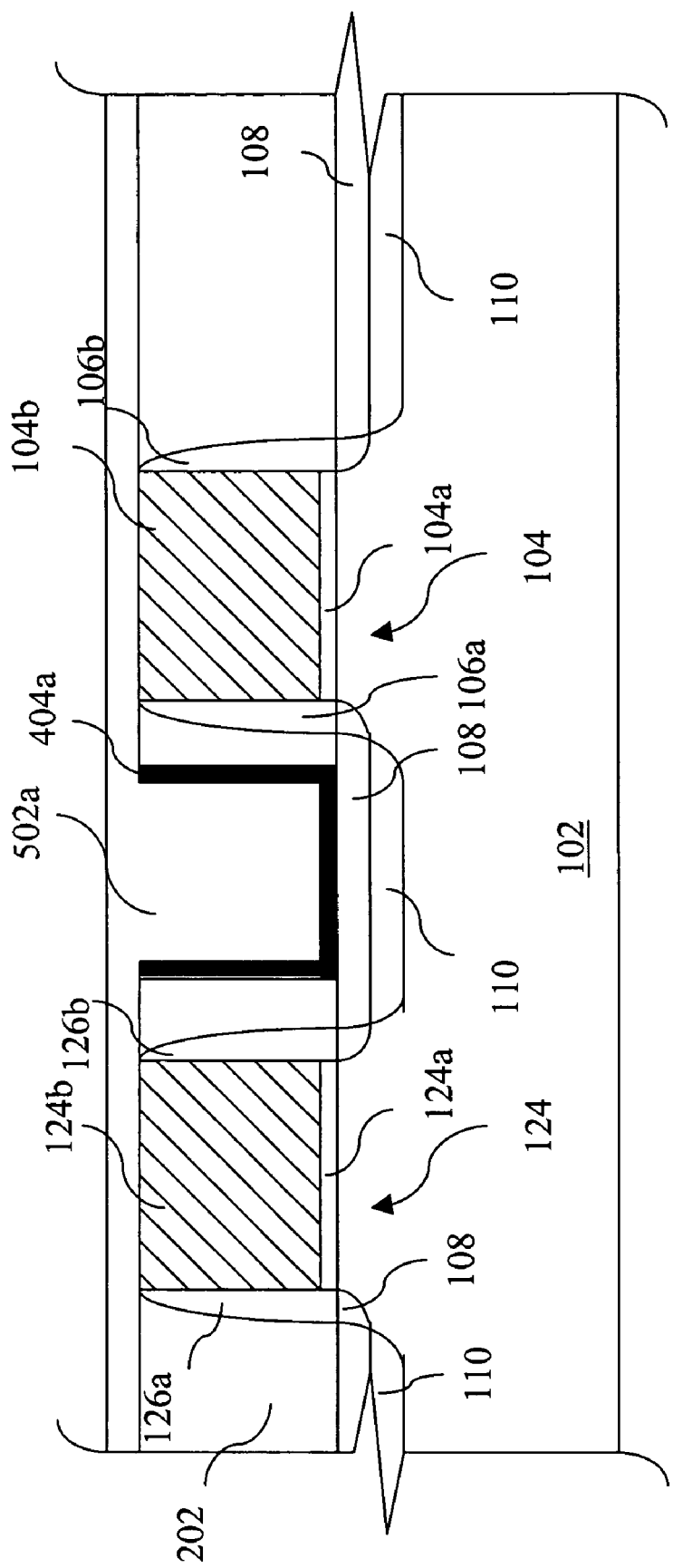
Figure 12B:
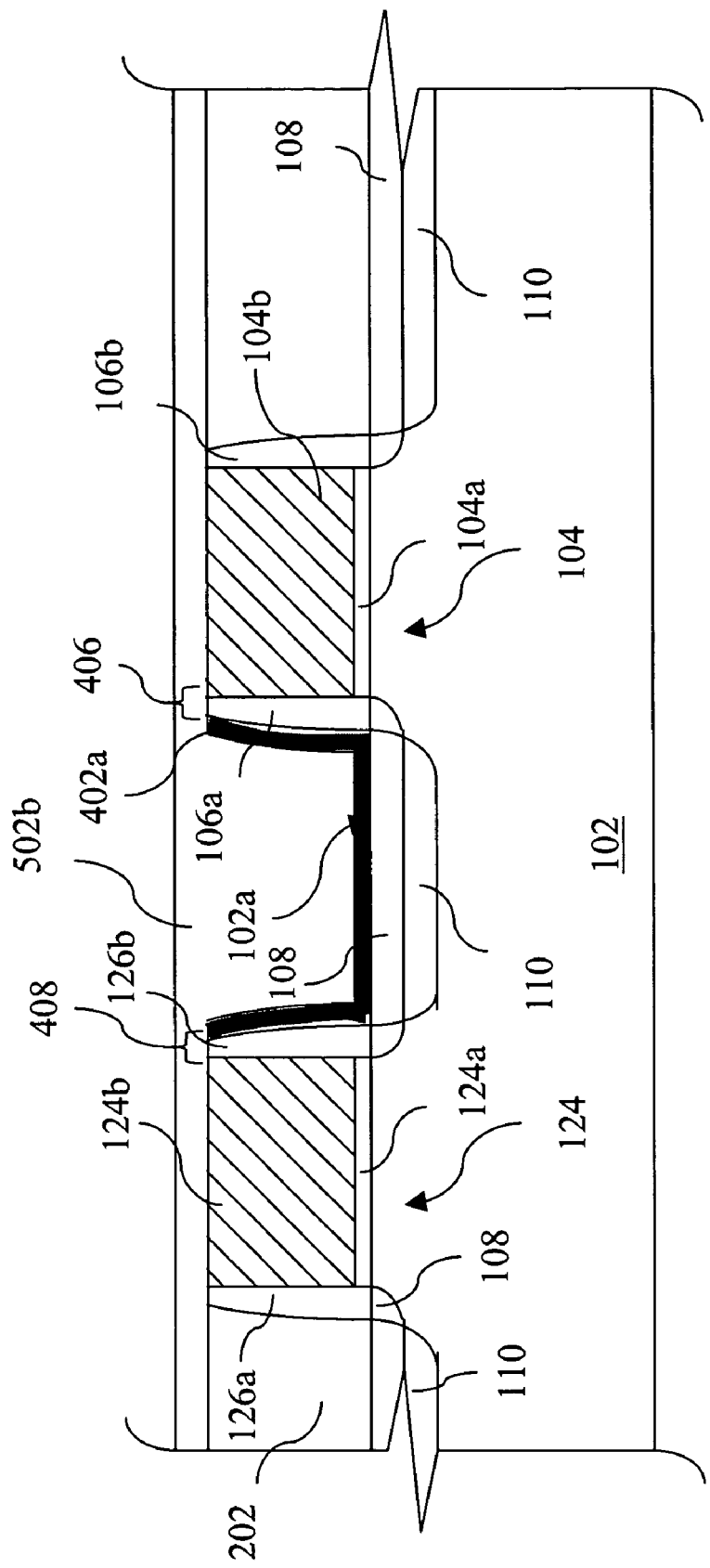
Figure 13:
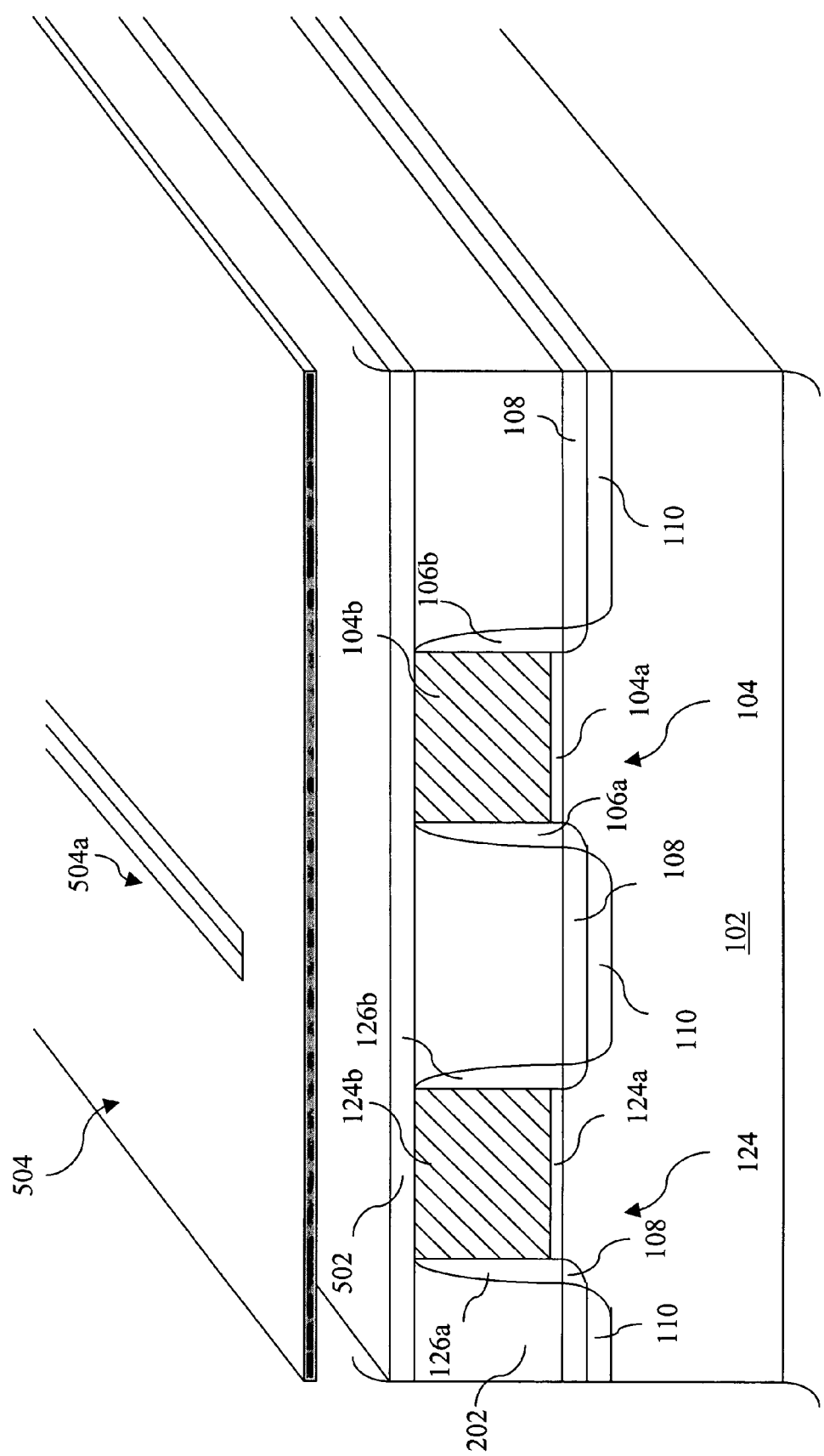
Figure 14A:
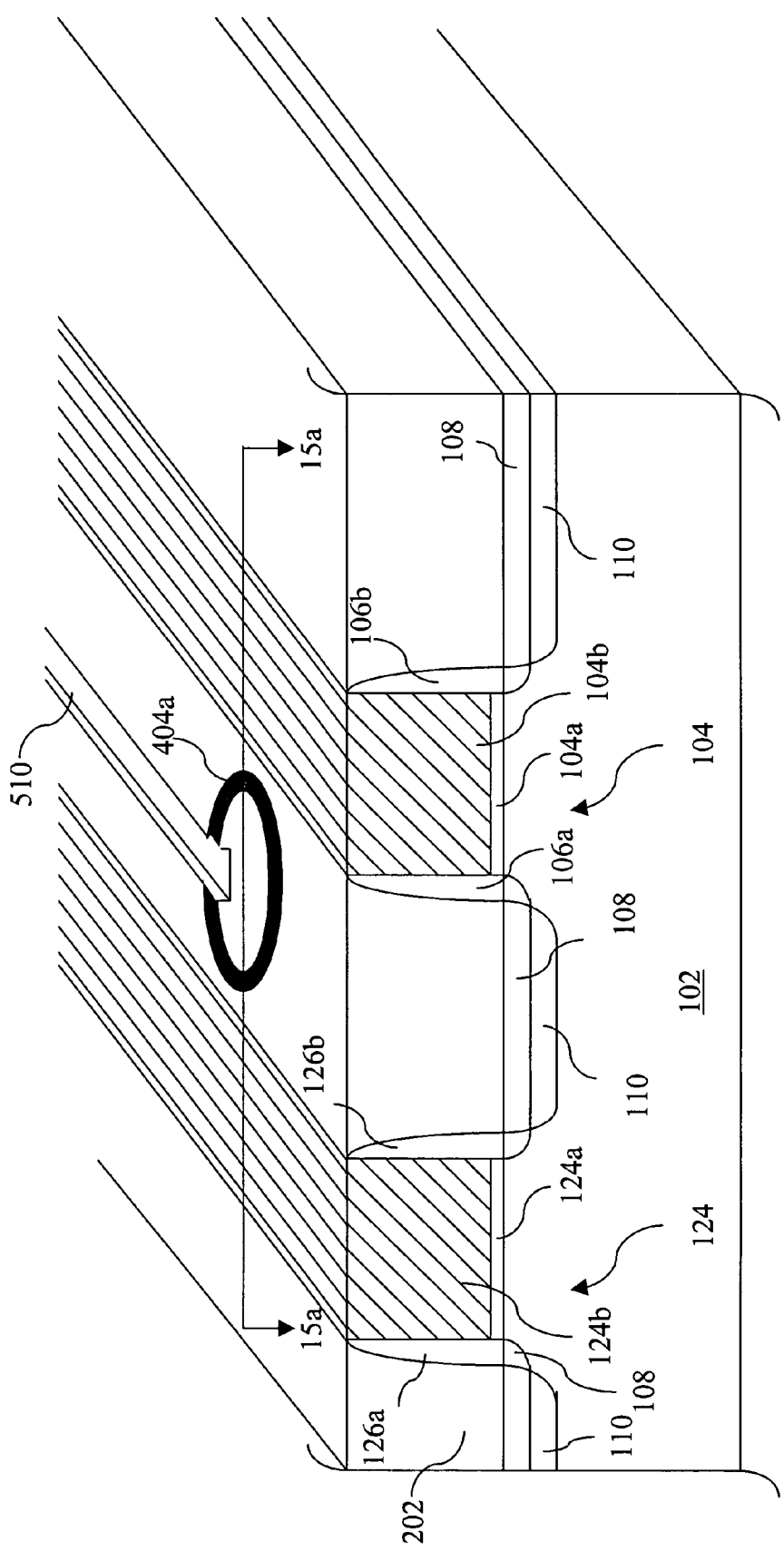
Figure 14B:
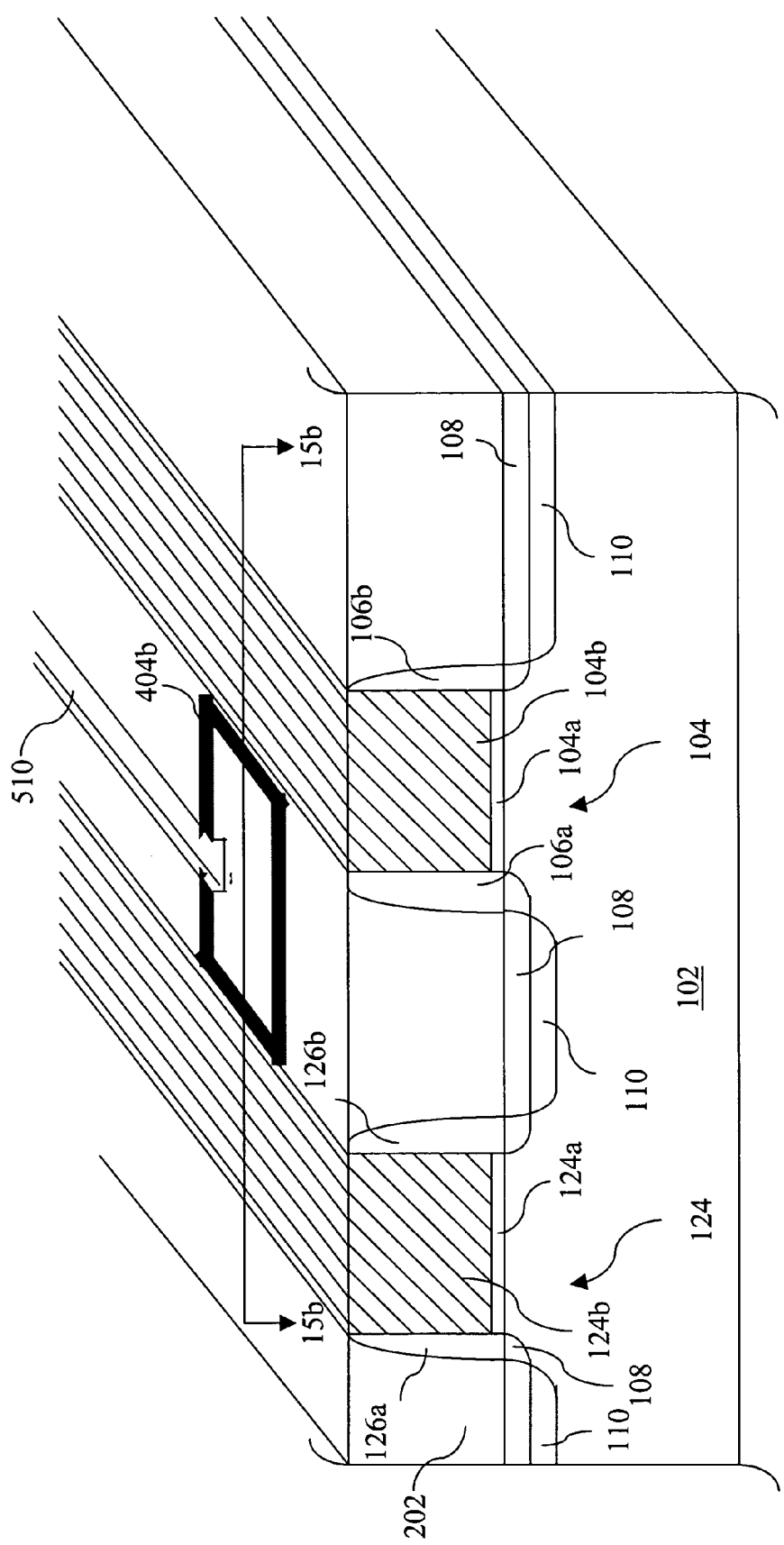
Figure 15A:
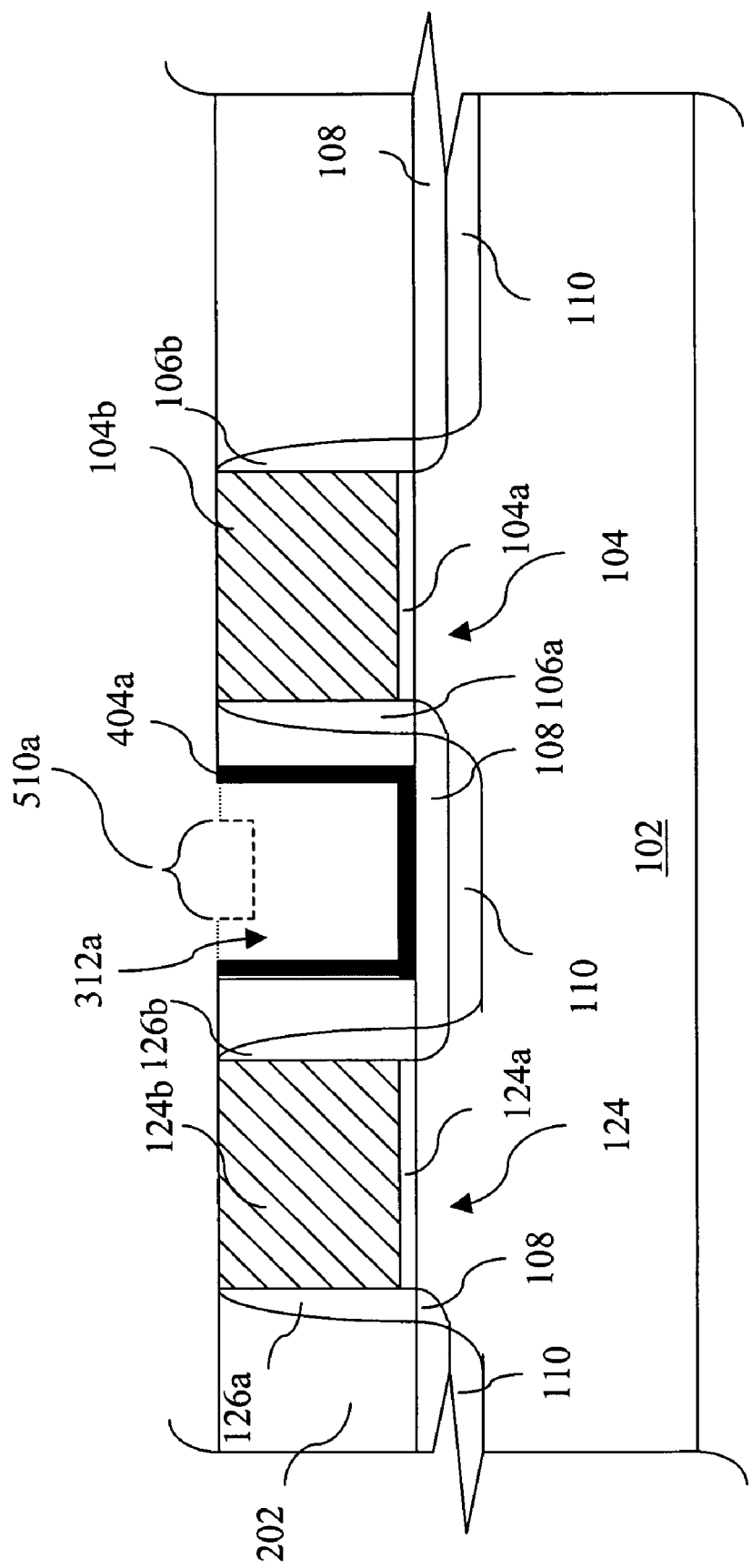
Figure 15B:
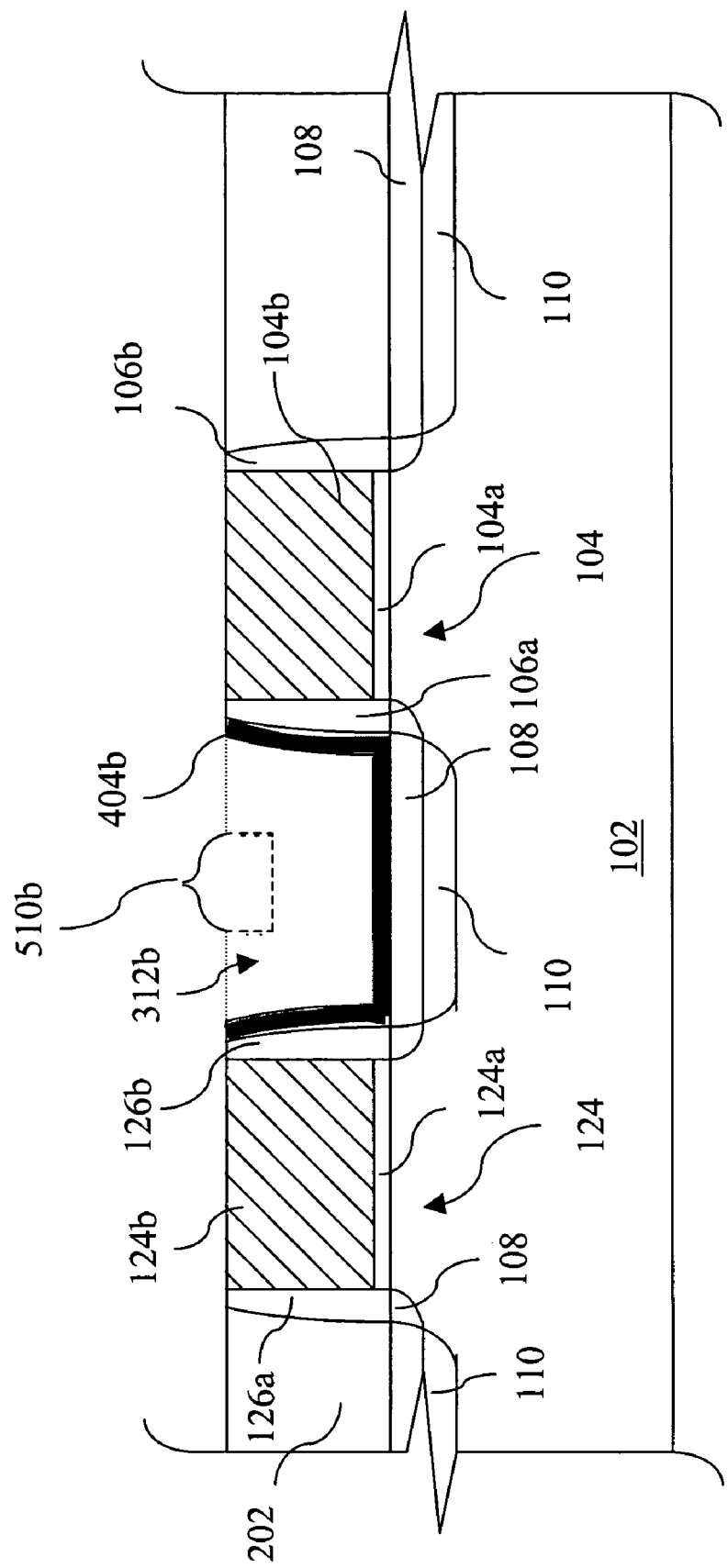

Alternative method to form a capacitor trench at step 300 may include forming a self-aligned capacitor trench using a selective etching, as illustrated in FIGS. 4, 5b, 6b, 7b, and 8b. Selective etch may have higher etching rate of the dielectric layer 202 than that of the gate electrodes 104b and 124b. For example, when the dielectric layer 202 comprises silicon oxide and the dummy gate electrodes comprise polysilicon, hydrofluoric (HF) acid or buffered hydrofluoric (BHF) acid solution may be used as an etchant since HF (or BHF) solution has a higher removal rate of silicon oxide than that of polysilicon. Thus silicon oxide can be removed while the polysilicon substantially remains. If the dielectric layer in the region between the dummy gates 104 and 124 are expected to be etched away to form a trench while the dielectric layer in the other regions, as shown in the FIG. 5b, are protected from etching. A photomask 304b having an passageway 306b may be used for the purpose. The passageway 306b may be designed in a proper shape such as a circular, an ellipse, and a rectangular. An exemplary passageway illustrated in FIG. 5b is a rectangular. A photoresist opening 310b may be formed, as shown in FIG. 6b, having a pattern deviation caused by photomask dimension error, alignment error, photolithography patterning error, and/or other processing errors. During the selective etching processing, only the dielectric layer exposed in the photoresist opening 310b can be substantially etched away to form a trench 312b as shown in FIG. 8b while the exposed portions of the dummy gate 104 and 124 remain substantially unchanged. Thus the trench 312b is automatically aligned with the dummy gates 104 and 124 by suing selective-etching, referred to as a self-aligned trench. As long as the photoresist opening 310b covers the dielectric layer in the regions expected to remain, the misalignment, shift, and other deviation of the opening resulting in exposure of the dummy gate electrode regions will not lead to deviation of the self-aligned trench. Thus, the processing window of the trench 312b patterning is much broad. Furthermore, the area of the trench 312b can be maximized for design margin such as in designing a capacitor for DRAM.

Referring now to FIGS. 1, 9a, 10a, and 11a, the method 10 continues at step 400 where a bottom electrode layer 402a may be formed over the bottom and sidewalls of the capacitor trench 312a and the surfaces of the dummy gates 104 and 124. In an exemplary embodiment, the bottom electrode layer 402 may include materials such as, but not limited to, copper, copper alloy, titanium, titanium nitride, tantalum, tantalum nitride, tungsten, metal silicide, and a variety of other conductive materials. The bottom electrode layer 402a is then planarized with the dielectric layer 202 and the dummy gates 104 and 124 such that a bottom electrode 404 is formed in the capacitor trench 312a with the dielectric layer top surface and dummy gate electrodes partially exposed. The planarization processing of the bottom electrode layer 402a with the dielectric layer 202 and the dummy gates 104 and 124 may be achieved using methods known in the art such as, but not limited to, chemical mechanical planarization (CMP).

Referring now to FIGS. 1, 9b, 10b, and 11b, an equivalent method to form a bottom electrode layer 402b and a bottom electrode 404b at step 400 of the method 10 may be substantially similar to the described above method to form the bottom electrode layer 402a and the bottom electrode 404a except for that planarization processing (of the bottom metal layer 402b to form the bottom electrode 404b) may resume beyond the top surface of the dummy gate electrodes 104b and 124b and over-polish the dielectric layer 202. During the over-polishing processing, the dummy gate electrode 104b is partially removed to form a gap 406 between the bottom electrode 404b. Similarly, the dummy gate electrode 124b is partially removed to form a gap 408 between the bottom electrode 404b and the dummy gate electrode 124b. The gaps 406 and 408 assure that the bottom electrode 404b is electrically isolated from the dummy gate electrodes and so from gate electrodes formed in later processing steps. Over-polishing endpoint may be determined in a time mode such that the gaps have proper dimensions.

Referring now to FIGS. 1, 12a, 13, 14a, and 15a, the method 10 continues at step 500 where a micro trench is formed. A layer of photoresist 502 is deposited over the dielectric layer, the dummy gate 104, and the bottom electrode 404a in the capacitor trench 312a. A photomask 504 defining a passageway 504a may be positioned above the photoresist 502 during photolithography processing. The photolithography processing is similar to the photolithography described in step 300 of the method 10. Development of the photoresist 502 exposes an area of the dielectric layer extending out from the capacitor trench 312a, which allowed the dielectric layer 202 to be etched, resulting in the dielectric layer 202 defining a micro trench 510 in abutment with and extended out from the bottom electrode 404 in capacitor trench 312. Etching may be performed using methods known in the art including, but not limited to, wet etching, dry etching, RIE, and many other suitable methods. The photoresist 502 is then removed by stripping or plasma ashing after the micro trench is formed by etching, exposing dielectric layer 202, dummy gate electrode 104b, and the bottom electrode 404a. With reference to FIGS. 1, 12b, 13, 14b, and 15b, step 500 of the method 10 to form a micro trench in the dielectric layer having the self-aligned trench is substantially similar to the method described above.

Figure 16A:
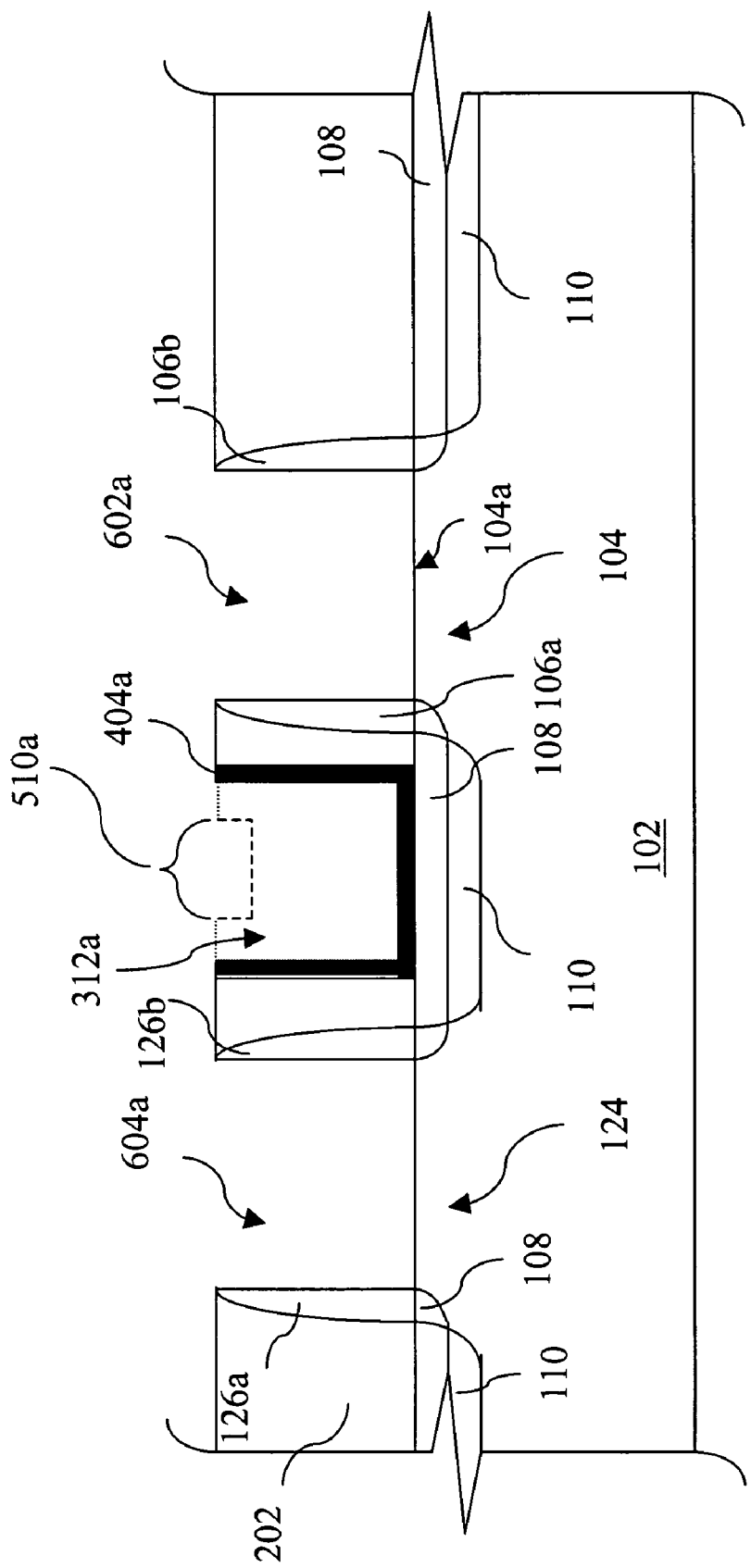
Figure 16B:
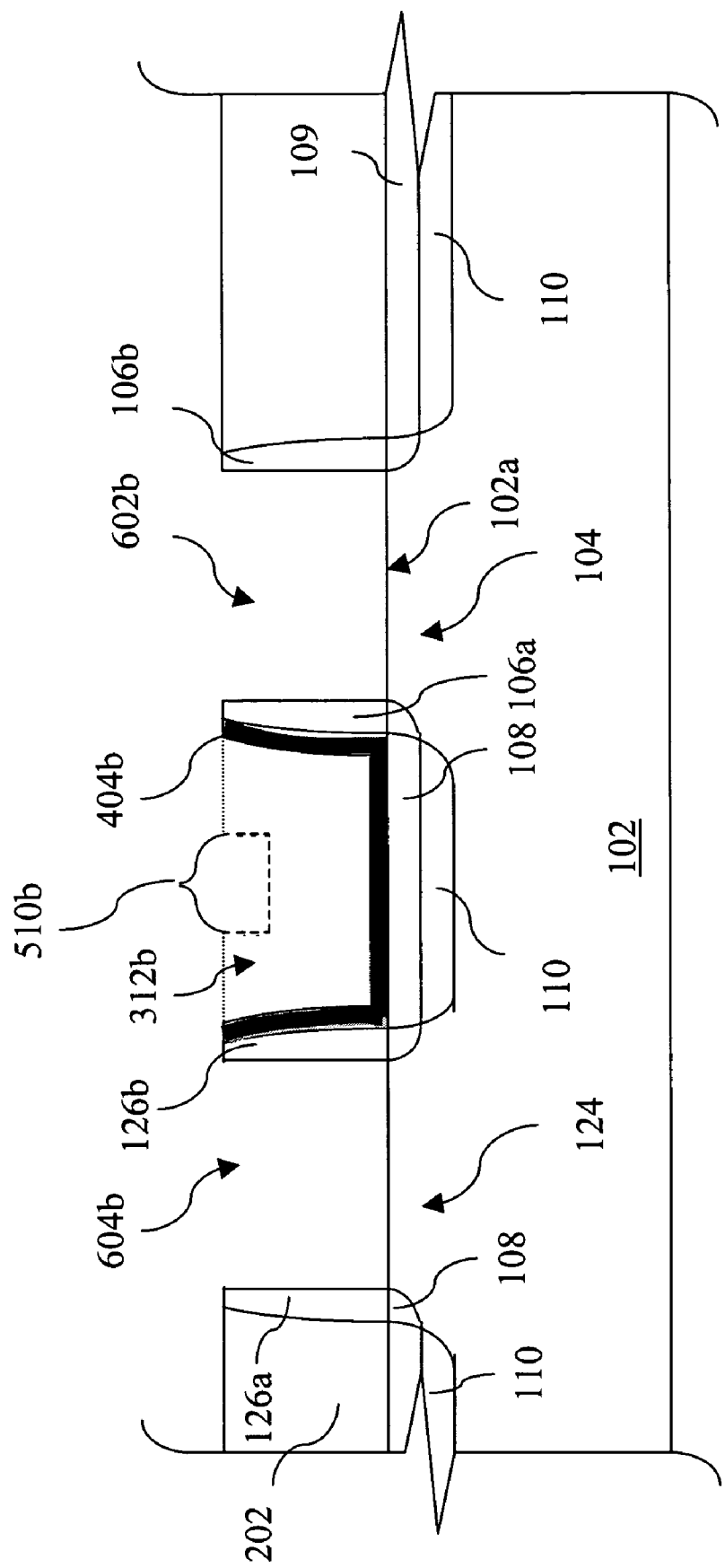

Referring now to FIGS. 1 and 16a (or 16b), the method 10 continues at step 600 where the dummy gates 104 and 124, including the dummy gate dielectrics 104a and 124a and the dummy gate electrodes 104b and 124b, are removed, resulting in the dielectric layer 202 and the substrate 102 defining a gate channel 602a (or 602b) extending from the top surface of the dielectric layer 202 to the substrate surface 102a.

Figure 17A:
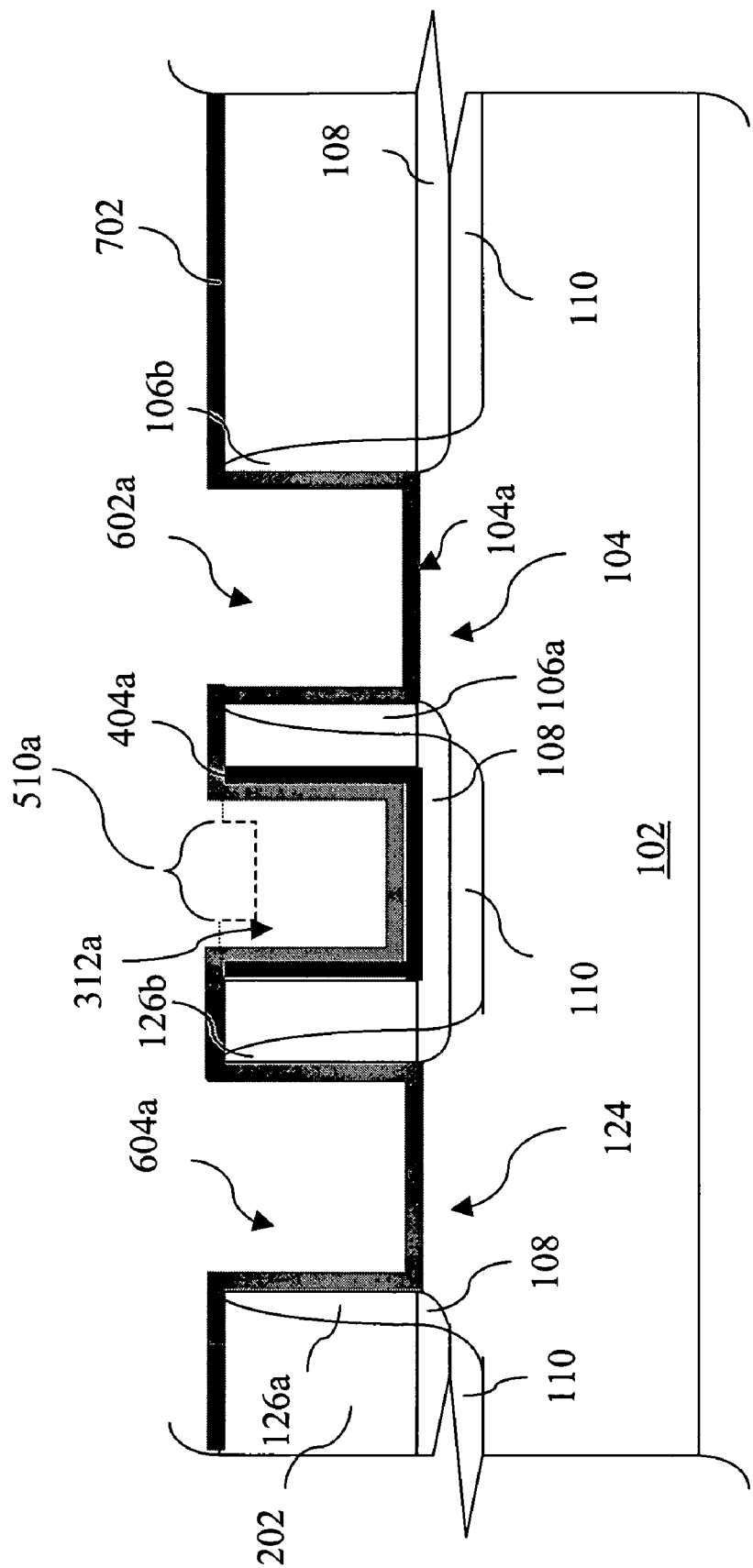
Figure 17B:
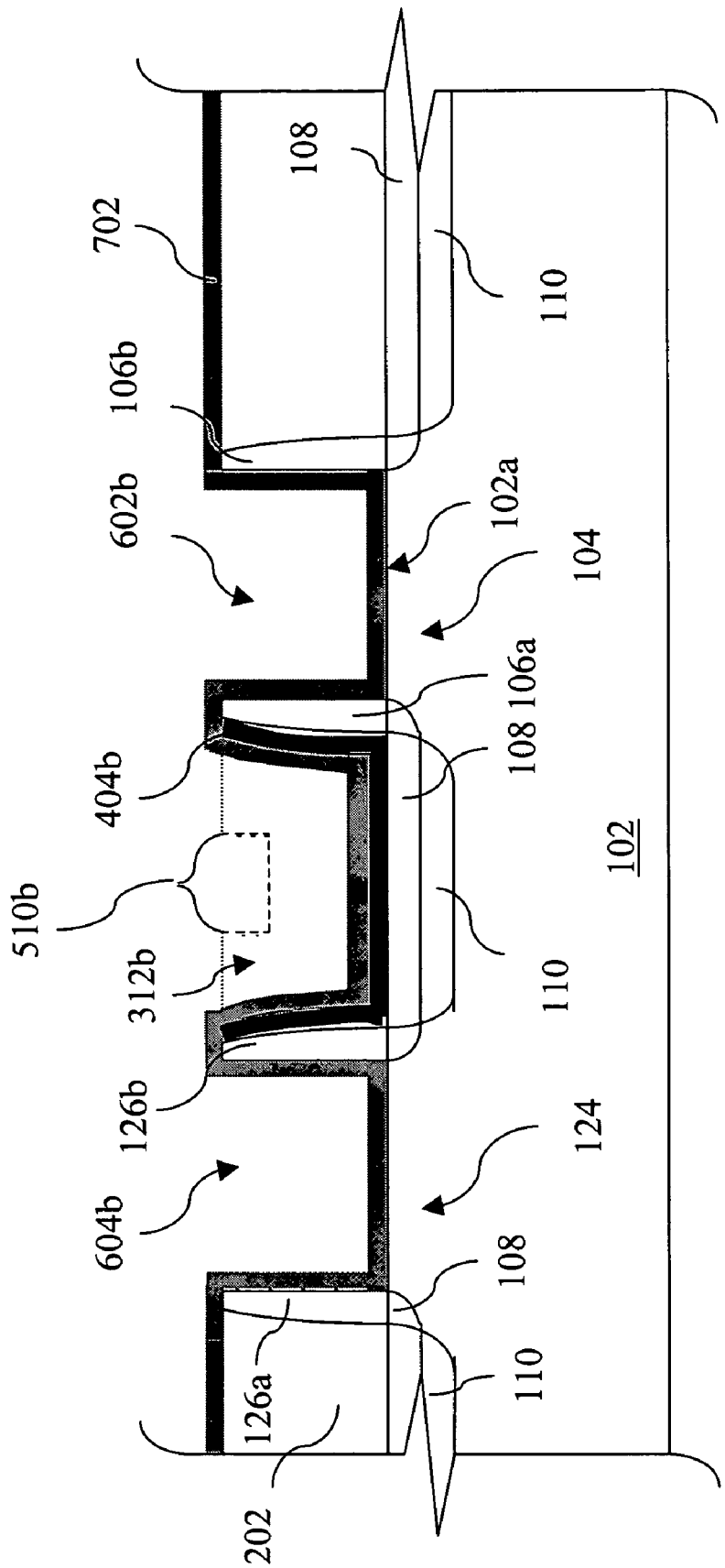

Referring now to FIGS. 1 and 17a (or 17b), the method 10 continues at step 700 where a dielectric layer 702 is formed on the dielectric layer 202, the bottom electrode 404a (or 404b) in the capacitor trench 312a (or 312b), and in the gate channel 602a (or 602b). In one embodiment, the dielectric layer 702 may include conventional dielectric materials such as, but not limited to, SiO or SiON, fluorinated silica glass (FSG), or high dielectric-constant (high K) materials such as, but not limited to, $Ta_2O_5$, $HfO_2$, $Al_2O_3$, $InO_2$, $LaO_2$, $ZrO_2$, $TaO_2$, combinations thereof, or a variety of other materials. In another embodiment, a first dielectric layer may already have been formed in the capacitor trench 312a (or 312b), in step 400, by a method similar to that of step 700 in composition and formation if the specifications for the gate dielectric and capacitor dielectric require different thicknesses.

Figure 18A:
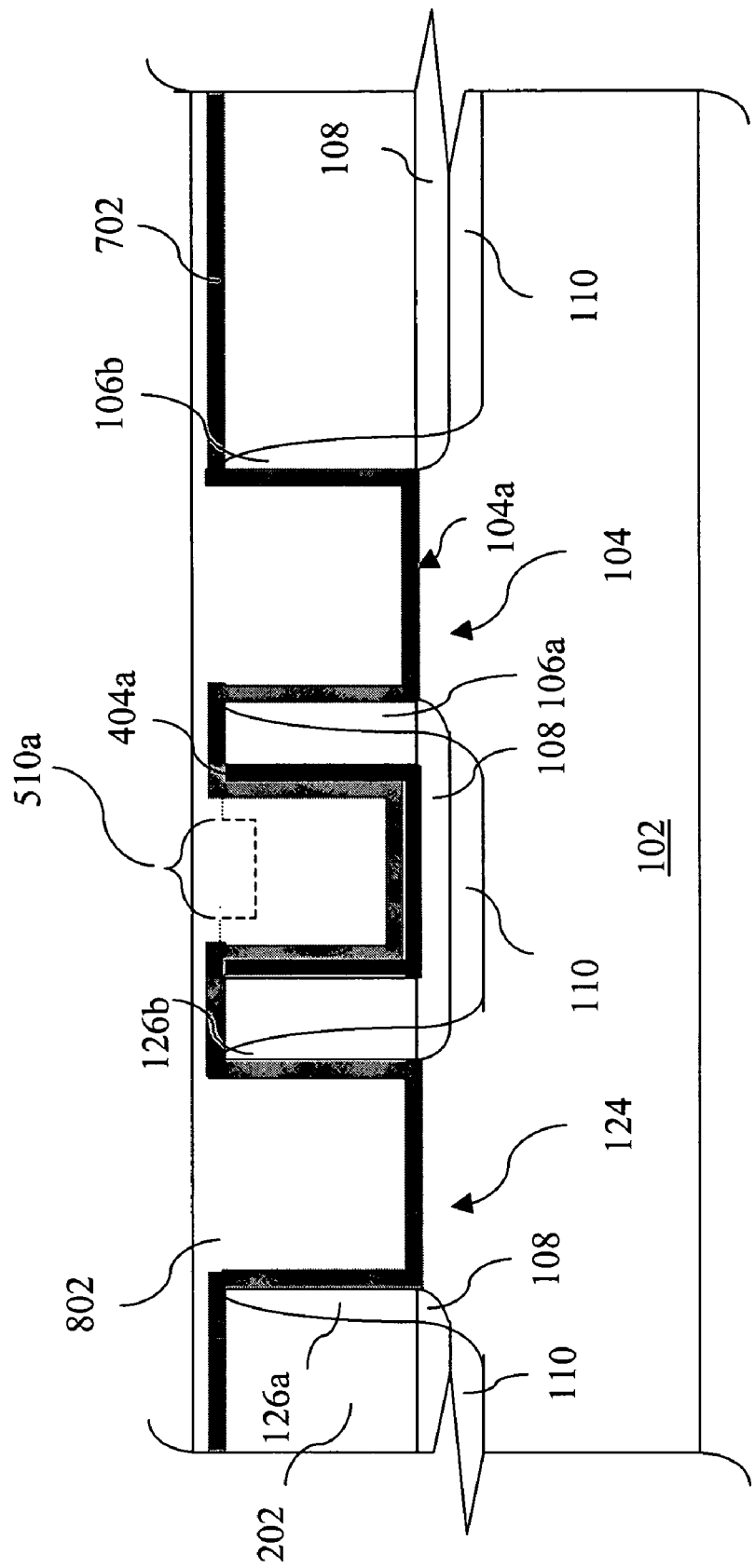
Figure 18B:
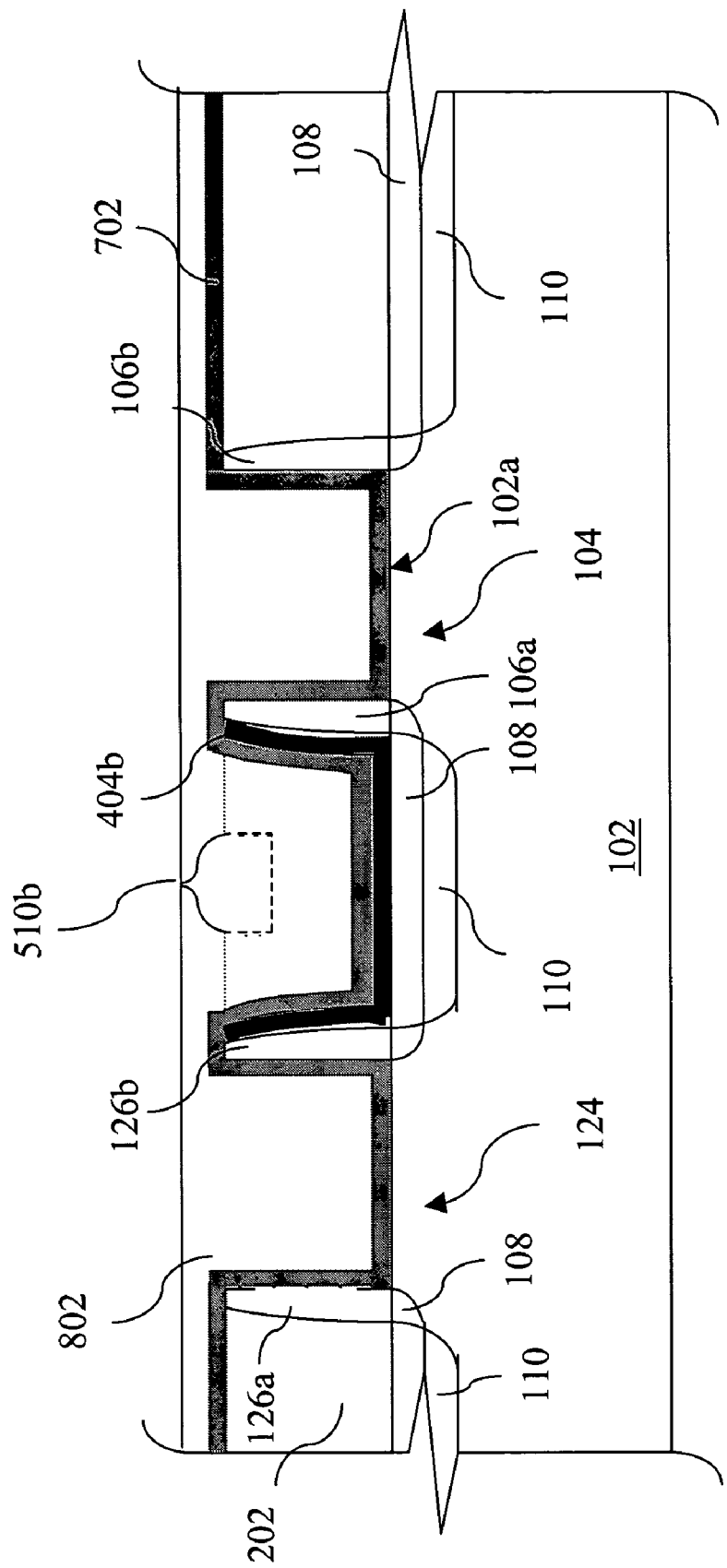
Figure 19A:
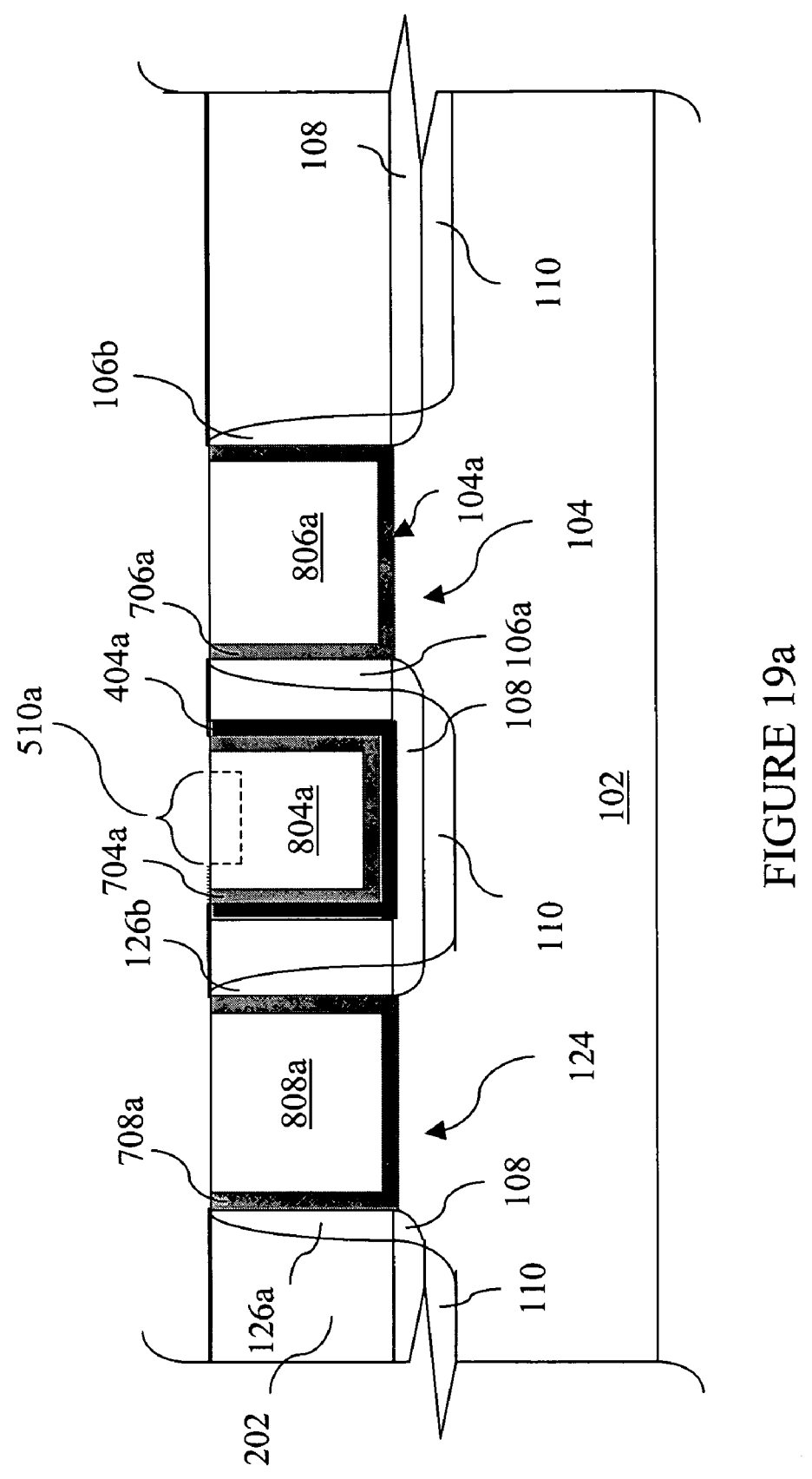
Figure 19B:
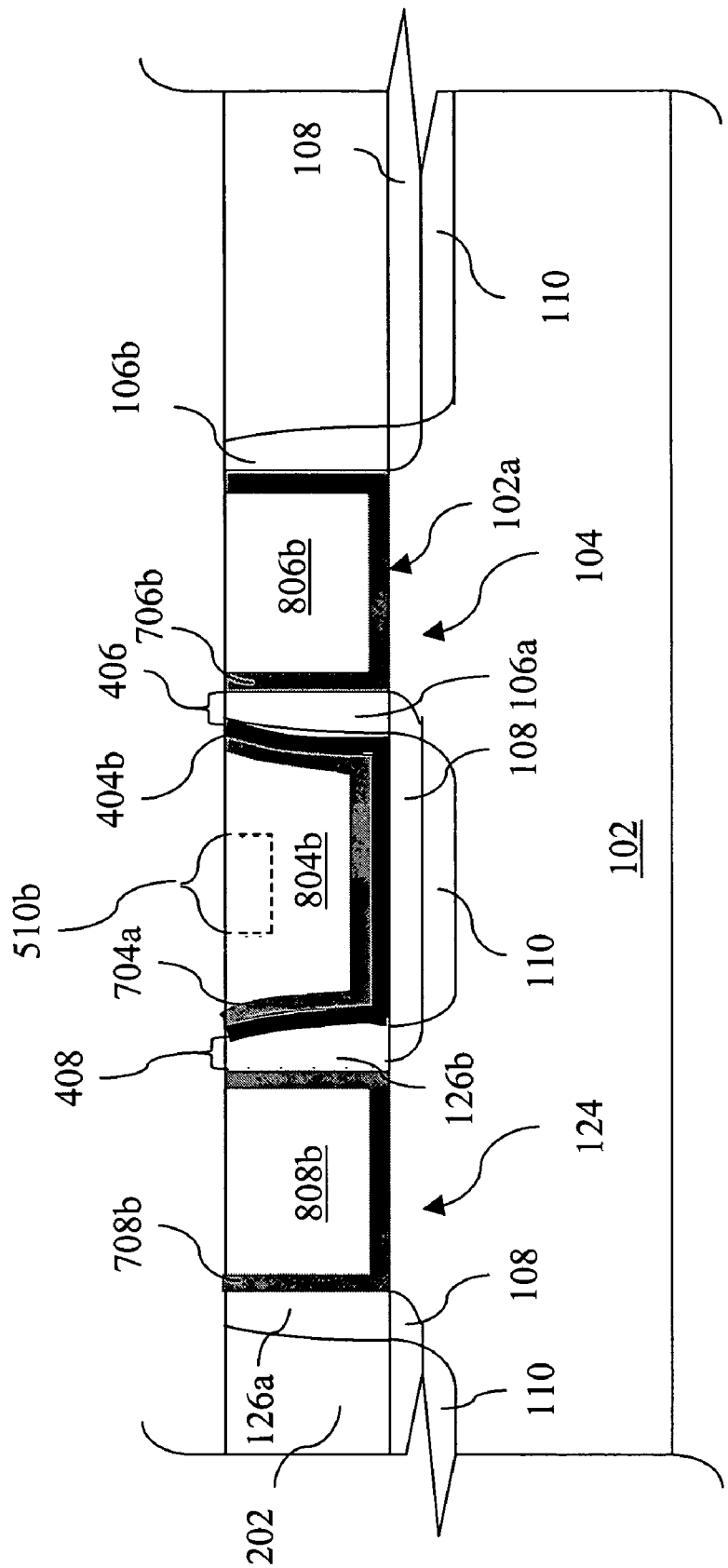

Referring now to FIGS. 1, 18a, and 19a, the method 10 continues at step 800 where a metal layer 802 is formed over the dielectric layer 702. In an exemplary embodiment, the metal layer 802 may be substantially similar to the bottom electrode layer 402 in composition and formation. The metal layer 802 and the dielectric layer 702 are then planarized with the dielectric layer 202, such that the dielectric layer 202 is exposed, to form a capacitor insulator feature 704a and top capacitor electrode 804a in the capacitor trench 312a, a gate dielectric feature 706a and a gate electrodes 806a in the gate channel 602a, and a gate dielectric feature 708a and a gate electrodes 808a in the gate channel 604a. A metal-insulator-metal (MIM) capacitor 810 and a metal gate stack 812 are formed therefore. In an exemplary embodiment, the planarizing of metal layer 802 and the dielectric layer 702 with the dielectric layer 202 may be achieved using methods known in the art such as, but not limited to, CMP. Alternatively, A method to form a capacitor insulator feature 704b and top capacitor electrode 804b in the capacitor trench 312b, a gate dielectric feature 706b and a gate electrodes 806b in the gate channel 602b, and a gate dielectric feature 708b and a gate electrodes 808b in the gate channel 604b, with reference to FIGS. 1, 18b, and 19b, may be substantially similar to the above described method. However, the planarization processing may resume beyond the top surface of the dielectric layer 202 and over polish the dielectric layer 702, the metal layer 802, and also the spacers 106b and 126b such that the widths of the gaps 406 and 408 are enlarged.

Contacts for interconnects may be formed on the substrate. For example, a dielectric layer may be formed over the substrate and patterned to form contact holes such that the contact holes extend to proper doped regions in the substrate according to design specification. The patterning method may be any proper processing such as photolithography and etching. The dielectric layer having the contact holes may be substantially similar to the dielectric layer 202 in composition and formation. The contact hole may be then filled with conductive material substantially similar in composition to the metal layers 402 and 802. The filled conductive material is then planarized by a process such as CMP to form contact features. Alternatively, other contact features may be formed in other regions to electrically connect proper active areas such as the top capacitor electrode 804 and the gate electrode 806. Other interconnect features such as vias and metal lines may also be formed by suitable processes known in the art.

In an exemplary embodiment, the method described provides a transistor including a metal gate feature and a passive component including a MIM capacitor. In an exemplary embodiment of the alternative method, a self-aligned MIM capacitor is formed with metal gate. By the self-aligned method, the capacitor area is maximized, the processing window is broader, and the two gaps are symmetrically disposed.

An exemplary photolithography processing involved in various steps may include photoresist patterning, etching, and photoresist stripping. The photoresist patterning may further include processing steps of photoresist coating, soft baking, mask aligning, exposing, post-exposure baking, developing photoresist, and hard baking. Photolithography patterning may also be implemented or replaced by other suitable methods such as maskless photolithography, electron-beam writing, ion-beam writing, optical writing, and molecular imprint.

The conductive materials used to form conductive features such as capacitor electrodes, gate electrode, and interconnect may include Cu, W, Ti, Ta, TiN, TaN, NiSi, CoSi, and/or other proper conductive material. The conductive features may be formed by CVD, PVD, plating, ALD, and other suitable processes. The dielectric materials used to form gate dielectric, capacitor insulator layer, and other proper dielectric layers may include silicon oxide, silicon nitride, silicon oxynitride, and/or a high K material. High K material may comprise hafnium oxide, hafnium silicide, hafnium silicon oxide, hafnium silicon oxynitride, zirconium oxide, aluminum oxide, a hafnium dioxide-alumina ($HfO_2$—$Al_2O_3$) alloy, silicon nitride, tantalum pentoxide, or combinations thereof. The dielectric materials used to form gate spacers, interlayer dielectric layer, shallow trench isolation, and other isolation features may include silicon oxide, silicon nitride, silicon oxynitride, fluoride-doped silicate glass (FSG), and/or a low K material. The low K material may comprise Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The dielectric materials may be formed by thermal oxidation, CVD, ALD, PVD, spin-on coating and/or other processes. The both conductive and dielectric materials may be formed and patterned in an integrated process such as a dual damascene process.

In an exemplary embodiment, the method described provides a transistor having a metal gate feature and a passive component having a metal-insulator-metal (MIM) capacitor. In an exemplary embodiment, the method described provides an embedded DRAM feature, or an integrated structure including a DRAM and complementary metal-oxide-semiconductor (CMOS) transistor. An integrated circuit formed therewith may include a logic region and a memory region wherein each region comprises a plurality of gates stacks and the memory region comprises a plurality of capacitors.

A method of manufacturing a MIM capacitor and a metal gate on a semiconductor device may include providing a substrate having a logic region and a memory region; forming a plurality of dummy gates on the substrate in the logic region and memory region; forming a trench layer on the substrate and adjacent the plurality of dummy gates; forming a plurality of capacitor trenches in the trench layer on the memory region of the substrate; forming a bottom electrode layer in the plurality of capacitor trenches; forming at least one micro trench extending between at least two capacitor trenches; removing the plurality of dummy gates to form a plurality of gate trenches; forming a dielectric layer; and forming a metal layer over the dielectric layer.

The integrated circuit may further comprise, in addition to DRAM and CMOS transistor, passive components such as resistors and inductors, and active components such as bipolar transistors, high voltage transistors, high frequency transistors, other memory cells, or combinations thereof. The substrate may further include other isolation features such as shallow trench isolation (STI), local oxidation of silicon (LOCOS), and buried oxide layer (BOX).

It is understood that variations may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change, and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

The invention claimed is:

1. A method of manufacturing a capacitor and a metal gate comprising:
   forming a dummy gate on a substrate;
   forming a first dielectric layer on the substrate and adjacent the dummy gate;
   forming a capacitor trench in the first dielectric layer;
   forming a bottom electrode in the capacitor trench;
   removing the dummy gate to provide a gate trench;
   forming a second dielectric layer on the bottom electrode of the capacitor trench and in the gate trench; and
   forming a metal layer over the second dielectric layer in the capacitor trench and the gate trench.

2. The method of claim 1 further comprising forming a micro trench in the first dielectric layer and in abutment with the capacitor trench.

3. The method of claim 1 wherein the capacitor trench is formed in a DRAM region of the substrate.

4. The method of claim 1 wherein the second dielectric layer has a dielectric constant greater than 3.9.

5. The method of claim 1 wherein the second dielectric layer comprises a material selected from the group consisting of silicon oxide, silicon nitride, and silicon oxynitride.

6. The method of claim 1 wherein a doping profile is defined in the substrate adjacent the dummy gate.

7. The method of claim 1 wherein forming the bottom electrode comprises:
   depositing a bottom electrode layer over the substrate; and
   planarizing the bottom electrode layer to expose the first dielectric layer and the dummy gate, wherein a gap is formed between the dummy gate and the bottom electrode.

8. The method of claim 1 wherein forming the bottom electrode comprises
   depositing a bottom electrode layer over the substrate;
   depositing an insulating layer over the bottom electrode layer; and
   planarizing the insulating layer and the bottom electrode layer to expose the first dielectric layer and the dummy gate.

9. A method of manufacturing a capacitor and a metal gate on a semiconductor device comprising:
   providing a substrate, having a dummy gate formed on the substrate;
   forming a first dielectric layer on the substrate and adjacent the dummy gate;
   forming a self-aligned capacitor trench in the first dielectric layer;
   forming a bottom electrode in the capacitor trench having a separation from the dummy gate;
   removing the dummy gate to provide a gate trench;
   forming a second dielectric layer in the capacitor trench and the gate trench;
   forming a metal layer over the second dielectric layer in the capacitor trench and the gate trench; and
   planarizing the second dielectric layer and the metal layer to form a metal-insulator-metal (MIM) capacitor in the capacitor trench and a gate stack in the gate trench.

10. The method of claim 9 wherein forming the bottom electrode in the capacitor trench comprises planarizing the bottom electrode.

11. The method of claim 10 wherein planarizing the bottom electrode comprising partially removing the dummy gate and the first dielectric layer to form the separation from the dummy gate.

12. The method of claim 9 wherein planarizing the second dielectric layer and the metal layer comprises removing the gate stack and the trench layer to further separate the MIM capacitor from the gate stack.

13. A method of manufacturing a capacitor and a metal gate on a semiconductor device comprising:
   providing a substrate comprising a logic region and a memory region;
   forming a plurality of dummy gates on the substrate in the logic region and memory region;
   forming a first dielectric layer on the substrate and adjacent the plurality of dummy gates;
   forming a plurality of capacitor trenches in the first dielectric layer on the memory region of the substrate;
   forming a bottom electrode layer in the plurality of capacitor trenches;
   forming at least one micro trench extending between at least two capacitor trenches;
   removing the plurality of dummy gates to form a plurality of gate trenches;
   forming a second dielectric layer in the gate trenches and the capacitor trenches; and forming a metal layer over the second dielectric layer.

14. The method of claim 13 wherein the memory region includes a DRAM region.

15. The method of claim 13 wherein forming the metal layer over the second dielectric layer provides a plurality of MIM capacitors in the plurality of capacitor trenches and a plurality of metal gates in the plurality of gate trenches.

16. The method of claim 13 wherein the second dielectric layer has a dielectric constant greater than 3.9.

* * * * *